(12) United States Patent
Maeda et al.

(10) Patent No.: US 10,861,934 B2
(45) Date of Patent: Dec. 8, 2020

(54) SEMICONDUCTOR DEVICES INCLUDING PROTRUDING INSULATION PORTIONS BETWEEN ACTIVE FINS

(71) Applicant: Samsung Electronics Co., Ltd., Suwon-si (KR)

(72) Inventors: Shigenobu Maeda, Seongnam-si (KR); Hee-Soo Kang, Seoul (KR); Sang-Pil Sim, Seongnam-si (KR); Soo-Hun Hong, Gunpo-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/398,719

(22) Filed: Apr. 30, 2019

(65) Prior Publication Data

US 2019/0259836 A1 Aug. 22, 2019

Related U.S. Application Data

(60) Continuation of application No. 15/467,159, filed on Mar. 23, 2017, now Pat. No. 10,319,814, which is a
(Continued)

(30) Foreign Application Priority Data

Nov. 30, 2012 (KR) .................. 10-2012-0138132

(51) Int. Cl.
*H01L 29/06* (2006.01)
*H01L 29/78* (2006.01)
(Continued)

(52) U.S. Cl.
CPC .......... *H01L 29/0692* (2013.01); *B82Y 10/00* (2013.01); *H01L 21/823431* (2013.01);
(Continued)

(58) Field of Classification Search
None
See application file for complete search history.

(56) References Cited

U.S. PATENT DOCUMENTS

| 7,898,041 B2 | 3/2011 | Radosavljevic et al. |
| 7,960,734 B2 | 6/2011 | Lenoble |
(Continued)

FOREIGN PATENT DOCUMENTS

| CN | 102640274 A | 8/2012 |
| CN | 103227202 A | 7/2013 |
(Continued)

OTHER PUBLICATIONS

First Office Action, issued from the Korean Patent Office dated Jan. 8, 2019, in Korean Patent Application No. KR 10-2012-0138132 (18 pages).

*Primary Examiner* — Steven B Gauthier
(74) *Attorney, Agent, or Firm* — Muir Patent Law, PLLC

(57) ABSTRACT

A semiconductor device can include a field insulation layer including a planar major surface extending in first and second orthogonal directions and a protruding portion that protrudes a particular distance from the major surface relative to the first and second orthogonal directions. First and second multi-channel active fins can extend on the field insulation layer, and can be separated from one another by the protruding portion. A conductive layer can extend from an uppermost surface of the protruding portion to cross over the protruding portion between the first and second multi-channel active fins.

20 Claims, 26 Drawing Sheets

Related U.S. Application Data continuation of application No. 14/463,394, filed on Aug. 19, 2014, now Pat. No. 9,627,483, which is a division of application No. 14/021,465, filed on Sep. 9, 2013, now Pat. No. 8,836,046.

(51) Int. Cl.

| | | |
|---|---|---|
| *H01L 29/417* | (2006.01) | |
| *H01L 29/66* | (2006.01) | |
| *B82Y 10/00* | (2011.01) | |
| *H01L 21/8234* | (2006.01) | |
| *H01L 21/84* | (2006.01) | |
| *H01L 27/12* | (2006.01) | |
| *H01L 27/088* | (2006.01) | |
| *H01L 29/10* | (2006.01) | |
| *H01L 29/08* | (2006.01) | |
| *H01L 29/16* | (2006.01) | |
| *H01L 29/161* | (2006.01) | |
| *H01L 29/165* | (2006.01) | |
| *H01L 29/49* | (2006.01) | |
| *H01L 29/51* | (2006.01) | |
| *H01L 29/775* | (2006.01) | |

(52) U.S. Cl.
CPC ........ *H01L 21/845* (2013.01); *H01L 27/0886* (2013.01); *H01L 27/1211* (2013.01); *H01L 29/0649* (2013.01); *H01L 29/0653* (2013.01); *H01L 29/0847* (2013.01); *H01L 29/1037* (2013.01); *H01L 29/161* (2013.01); *H01L 29/165* (2013.01); *H01L 29/1608* (2013.01); *H01L 29/41791* (2013.01); *H01L 29/4966* (2013.01); *H01L 29/517* (2013.01); *H01L 29/66795* (2013.01); *H01L 29/785* (2013.01); *H01L 29/7848* (2013.01); *H01L 29/775* (2013.01)

(56) References Cited

U.S. PATENT DOCUMENTS

| | | | |
|---|---|---|---|
| 8,390,064 B2 | 3/2013 | Mikasa | |
| 8,735,993 B2 | 5/2014 | Lo et al. | |
| 8,928,093 B2 | 1/2015 | Lo et al. | |
| 9,312,384 B2 | 4/2016 | Lo et al. | |
| 2004/0103530 A1 | 6/2004 | Adachi et al. | |
| 2007/0111455 A1 | 5/2007 | Kim et al. | |
| 2008/0128797 A1 | 6/2008 | Dyer et al. | |
| 2008/0251779 A1 | 10/2008 | Kakoschke et al. | |
| 2008/0258207 A1 | 10/2008 | Radosavljevic et al. | |
| 2009/0065856 A1 | 3/2009 | Oyu et al. | |
| 2009/0090976 A1 | 4/2009 | Kavalieros et al. | |
| 2009/0294874 A1 | 12/2009 | Lee | |
| 2009/0315112 A1 | 12/2009 | Lee | |
| 2010/0159670 A1 | 6/2010 | Kobayashi et al. | |
| 2010/0276756 A1 | 11/2010 | Rachmady et al. | |
| 2011/0068431 A1 | 3/2011 | Knorr et al. | |
| 2011/0147831 A1* | 6/2011 | Steigerwald | H01L 21/823821 257/330 |
| 2011/0241098 A1 | 10/2011 | Park et al. | |
| 2011/0263094 A1 | 10/2011 | Lin et al. | |
| 2012/0074464 A1 | 3/2012 | Cea et al. | |
| 2012/0153387 A1 | 6/2012 | Murthy et al. | |
| 2012/0217583 A1 | 8/2012 | Zhu et al. | |
| 2013/0154016 A1 | 6/2013 | Glass et al. | |
| 2013/0187237 A1 | 7/2013 | Yu et al. | |
| 2013/0193526 A1* | 8/2013 | Lo | H01L 29/423 257/401 |
| 2013/0230958 A1 | 9/2013 | Lee et al. | |
| 2013/0270607 A1 | 10/2013 | Doornbos et al. | |
| 2013/0292777 A1* | 11/2013 | Liaw | G11C 11/419 257/369 |
| 2014/0070320 A1 | 3/2014 | Mukherjee et al. | |
| 2014/0103452 A1 | 4/2014 | Chang et al. | |

FOREIGN PATENT DOCUMENTS

| | | |
|---|---|---|
| JP | 2007-207837 | 8/2007 |
| JP | 2010-141107 A | 6/2010 |
| JP | 2011-119724 | 6/2011 |
| KR | 10-2000-0060634 A | 10/2000 |
| KR | 1020060118891 A | 11/2006 |
| KR | 1020070063203 A | 6/2007 |
| KR | 100866721 B1 | 10/2008 |

* cited by examiner

SEMICONDUCTOR DEVICES INCLUDING PROTRUDING INSULATION PORTIONS BETWEEN ACTIVE FINS

CROSS-REFERENCE TO RELATED APPLICATION

This application is a continuation of U.S. patent application Ser. No. 15/467,159, filed Mar. 23, 2017, which is a continuation of U.S. patent application Ser. No. 14/463,394, filed Aug. 19, 2014, which is a divisional of U.S. patent application Ser. No. 14/021,465, filed Sep. 9, 2013, which claims the benefit of priority under 35 U.S.C. § 119 from Korean Patent Application No. 10-2012-0138132, filed Nov. 30, 2012, in the Korean Intellectual Property Office, the contents of all of which are hereby incorporated by reference in their entireties.

FIELD

The present inventive concept relates to the field of semiconductors and, more particularly, to semiconductor devices including multichannel active fins.

BACKGROUND

Multi gate transistor structures have been provided including a fin-shaped or nanowire-shaped, multi-channel active pattern (or silicon body) on a substrate and a gate on a surface of the multi-channel active pattern.

Since multi gate transistors may utilize a three-dimensional channel, scaling may be more easily achieved than in other approaches. In addition, the ability to control current may also be improved without necessarily increasing the length of the gate in the multi gate transistor. Further, short channel effects, in which the potential of the channel region being affected by the drain voltage, may be more effectively addressed.

SUMMARY

Embodiments according to the inventive concept can provide semiconductor devices including protruding insulation portions between active fans. Pursuant to these embodiments, a semiconductor device can include a field insulation layer including a planar major surface extending in first and second orthogonal directions and a protruding portion that protrudes a particular distance from the major surface relative to the first and second orthogonal directions. First and second multi-channel active fins can extend on the field insulation layer, and can be separated from one another by the protruding portion. A conductive layer can extend from an uppermost surface of the protruding portion to cross over the protruding portion between the first and second multi-channel active fins.

BRIEF DESCRIPTION OF THE DRAWINGS

The above and other features and advantages of the present inventive concept will become more apparent by describing in detail preferred embodiments thereof with reference to the attached drawings in which.

DETAILED DESCRIPTION OF EMBODIMENTS ACCORDING TO THE INVENTIVE CONCEPT

Figure 1:
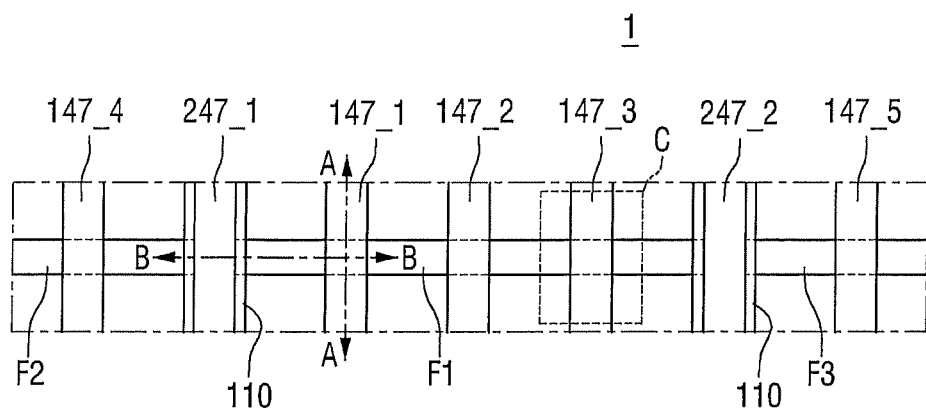
FIGS. 1 and 2 are a layout view and a perspective view of a semiconductor device according to some embodiments of the present inventive concept.

The inventive concept will is described fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 2:
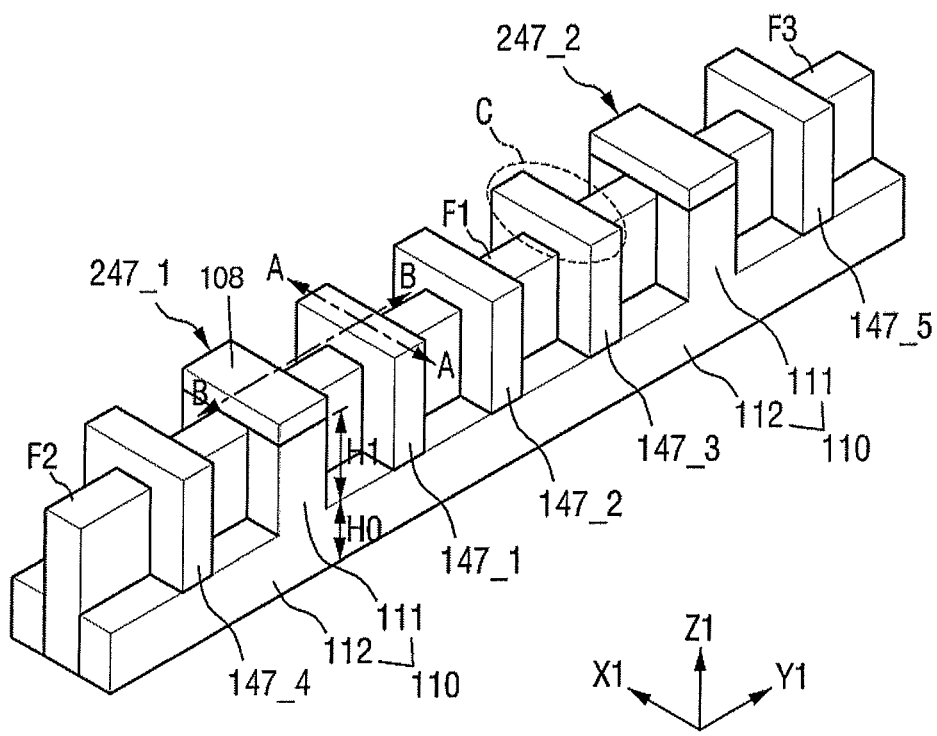
Figure 3:
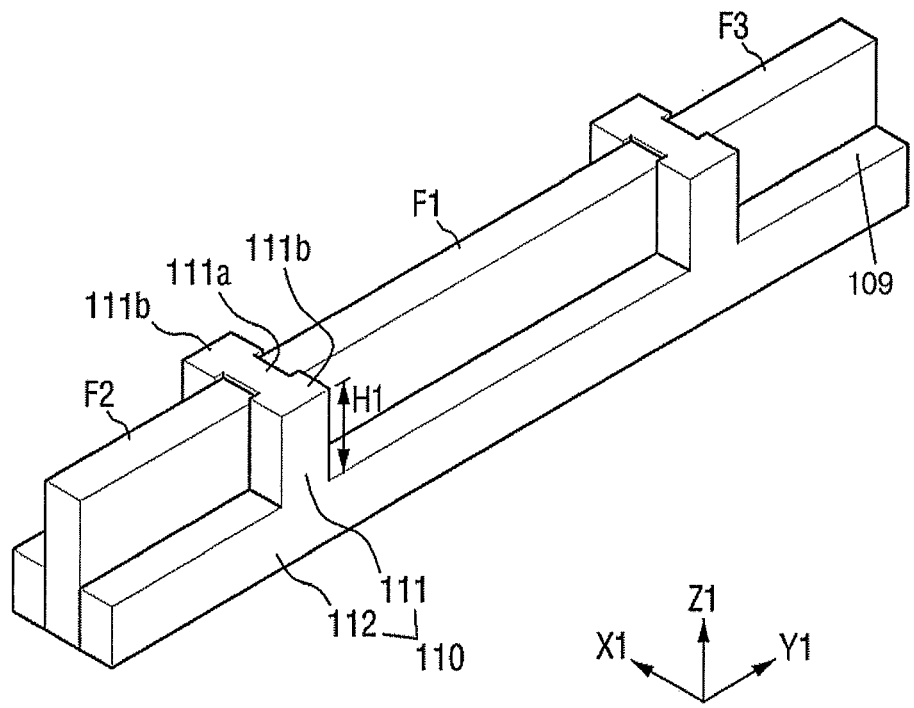
FIG. 3 is a partially perspective view illustrating a multi-channel active pattern and a field insulation layer in the semiconductor device according to some embodiments of the present inventive concept illustrated in FIGS. 1 and 2.
Figure 4:
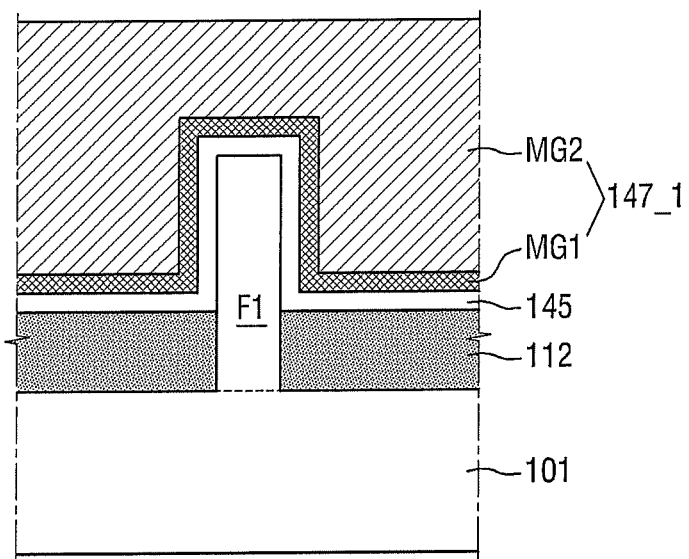
FIG. 4 is a cross-sectional view taken along the line A-A of FIGS. 1 and 2.
Figure 5:
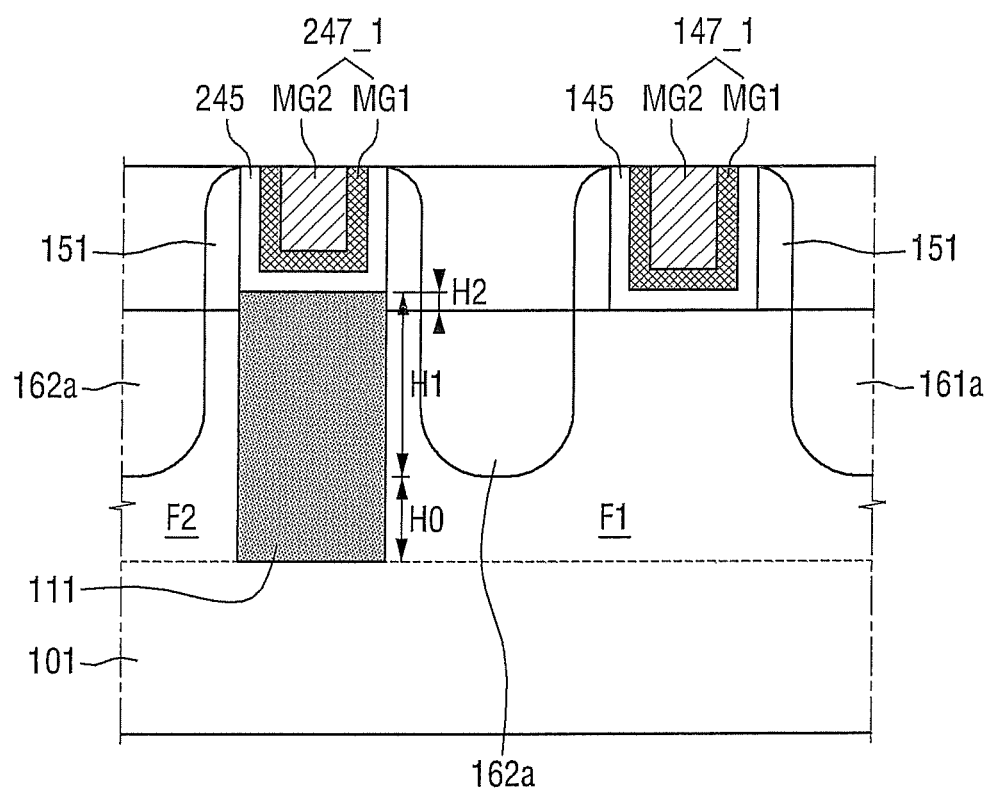
FIG. 5 is a cross-sectional view taken along the line B-B of FIGS. 1 and 2.
Figure 6:
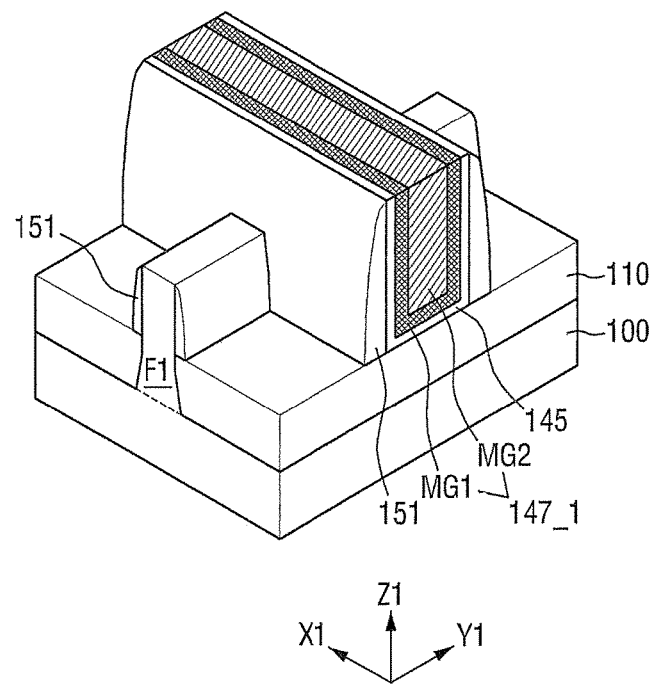
FIG. 6 is a perspective view illustrating a region C of FIGS. 1 and 2.
Figure 7:
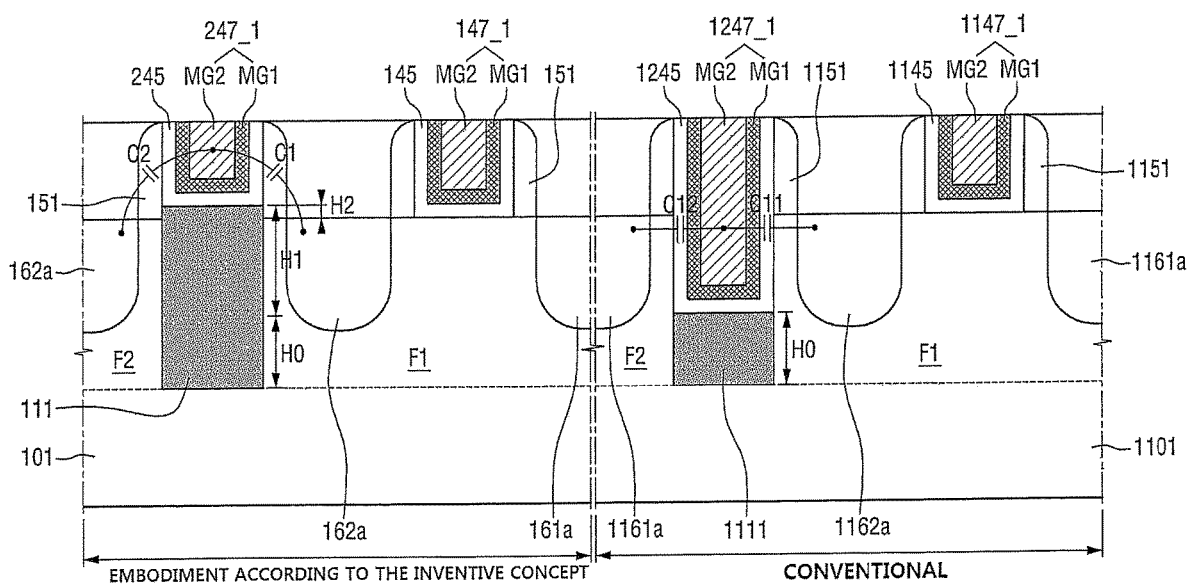
FIG. 7 is a cross-sectional illustration of the semiconductor device according to some embodiments embodiment of the present inventive concept compared to a conventional arrangement

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification FIGS. 1 and 2 are a layout view and a perspective view, respectively, of a semiconductor device according to some embodiments of the present inventive concept, FIG. 3 is a partially perspective view illustrating a multi-channel active pattern and a field insulation layer in the semiconductor device shown in FIGS. 1 and 2. Specifically, FIG. 3 illustrates a configuration of the semiconductor device shown in FIG. 2, except for a normal gate (sometimes referred to herein as an active gate) and a dummy gate. FIG. 4 is a cross-sectional view taken along the line A-A of FIGS. 1 and 2, FIG. 5 is a cross-sectional view taken along the line B-B of FIGS. 1 and 2, FIG. 6 is a perspective view illustrating a region C of FIGS. 1 and 2, and FIG. 7 illustrates the semiconductor device according to FIGS. 1-6 compared to a conventional arrangement.

Referring first to FIGS. 1 to 6, the semiconductor device 1 may include a plurality of multi-channel active patterns F1 to F3 (sometimes referred to herein as "fins"), a plurality of normal gates 147_1 to 147_5, a field insulation layer 110, a plurality of dummy gates 247_1 and 247_2, and a plurality of sources/drains 161a and 162a.

The plurality of multi-channel active patterns F1 to F3 may extend in a second direction Y1. Each of the multi-channel active patterns F1 to F3 may be part of a substrate 101 and may include an epitaxial layer grown from the substrate 101. In the illustrated embodiment, three multi-channel active patterns F1 to F3 arranged end to end with each other in a lengthwise direction are exemplified, but aspects of the present inventive concept are not limited thereto.

In the illustrated embodiment, the multi-channel active patterns F1 to F3 shaped of a rectangular parallelepiped are exemplified, but aspects of the present inventive concept are not limited thereto. That is to say, the multi-channel active patterns F1 to F3 may be chamfered. Specifically, corners of the multi-channel active patterns F1 to F3 may be rounded. Since the multi-channel active patterns F1 to F3 extend in a lengthwise direction along the second direction Y1, they may include long sides formed along the second direction Y1 and short sides formed along the first direction X1. Even if the corners of the multi-channel active patterns F1 to F3 are rounded, the long sides and short sides may be distinguished from each other by one skilled in the art. The multi-channel active patterns F1 to F3 may be fin-shaped or nanowire-shaped. In the illustrated embodiment, fin-shaped multi-channel active patterns F1 to F3 are exemplified.

The multi-channel active patterns F1 to F3 are defined to include active patterns used in a multi gate transistor. That is to say, when the multi-channel active patterns F1 to F3 are fin-shaped, channels may be formed (during operation) along three surfaces of a fin, or channels may be formed on two opposing surfaces of a fin. When the multi-channel active patterns F1 to F3 are nanowire-shaped, channel may be formed around a nanowire. The field insulation layer 110 may be formed on the substrate 101 and may surround portions of the plurality of multi-channel active patterns F1 to F3. The filed insulation layer can be formed to include a major surface 109 that extends in two directions (e.g., X1 and Y1) that are orthogonal to one another.

In detail, the field insulation layer 110 may include a first region (a protruding portion) 111 and a second region 112 having different heights. The height of the second region 112 may be H0, and the height of the first region 111 may be such that the first region protrudes from the major surface 109 by a particular distance H1. In detail, for example, the first region 111 may be formed to separate the short sides of the multi-channel active patterns F1 to F3, and the second region 112 may be formed to contact long sides of the multi-channel active patterns F1 to F3. The first region 111 may be formed under the dummy gates 247_1 and 247_2, and the second region 112 may be formed under the normal gates 147_1 to 147_5. In other words, a portion of the field insulation layer 110 (that is, the second region 112) may be disposed between opposing multi-channel active patterns (for example, between F1 and F2 or between F2 and F3). The first region 111 may be formed to extend in a first direction X1, and the second region 112 may extend in a second direction Y1 and in the first direction.

In addition, as shown in FIG. 3, the protruding portion 111 may be notched to surround end portions of the multi-channel active patterns F1 to F3 which are recessed therein. That is to say, the first region 111 may include a first part 111a and a second part 111b. The first part 111a and the second part 111b may have different widths. In detail, the width of the second part 111b may be greater than the width of the first part 111a. As the result, the second part 111b may surround each of the end portions of the multi-channel active patterns F1 to F3. In such a manner, it is possible to prevent the field insulation layer 110 and the dummy gates 247_1 and 247_2 to be formed thereon from being misaligned. As further shown in FIG. 3, the protruding portion 111 protrudes the particular distance H1 relative to the major surface 109 in both the X1 and Y1 directions. The field insulation layer 110 may be an oxide layer, a nitride layer, an oxynitride layer, or a combination thereof.

The plurality of normal gates 147_1 to 147_5 may be formed on the corresponding multi-channel active patterns F1 to F3 to cross the corresponding multi-channel active patterns F1 to F3. For example, first to third normal gates 147_1, 147_2 and 147_3 may be formed on the first multi-channel active pattern F1, a fourth normal gate 147_4 may be formed on the second multi-channel active pattern F2, and a fifth normal gate 147_5 may be formed on the third multi-channel active pattern F3. The normal gates 147_1 to 147_5 may extend in the first direction X1.

The plurality of dummy gates 247_1 and 247_2 may be formed on the corresponding field insulation layer 110 (that is, the first region 111 of the field insulation layer 110) to crossover the protruding portion 111 in the X1 direction. For example, the first dummy gate 247_1 may be formed on the first region 111 shown in the left side of FIG. 2, and the second dummy gate 247_2 may be formed on the first region 111 shown in the right side of FIG. 2. In particular, each of the dummy gates 247_1 and 247_2 may be formed on the corresponding first region 111 one by one. Two or more of the dummy gates 247_1 and 247_2 are not formed, but the dummy gates 247_1 and 247_2 are formed one by one, thereby reducing the layout size. It will be understood that the dummy gates may extend in the X1 direction, for example, to cross-over another fin, to form a part of an active gate, such as a pass transistor.

Referring to FIGS. 4 and 5, each normal gate (e.g., 147_1) may include metal layers MG1 and MG2. As shown in FIGS. 4 and 5, the normal gate 147_1 may be configured such that two or metal layers MG1 and MG2 are stacked. The first metal layer MG1 may control a work function, and the second metal layer MG2 may fill a space formed by the first metal layer MG1. For example, the first metal layer MG1 may include at least one of TiN, TaN, TiC, and TaC. In addition, the second metal layer MG2 may include W or Al. The normal gate 147_1 may be formed by, for example, a replacement process or a gate last process, but aspects of the present inventive concept are not limited thereto.

Each dummy gate (e.g., 247_1) may have a configuration similar to that of the normal gate 147_1. As shown, the dummy gate 247_1 may be configured such that two or metal layers MG1 and MG2 are stacked. For example, the first metal layer MG1 may control a work function, and the second metal layer MG2 may fill a space formed by the first metal layer MG1.

The gate insulation layer 145 may be formed between the multi-channel active pattern F1 and the normal gate 147_1. As shown in FIG. 4, the gate insulation layer 145 may be formed on a top surface and side surfaces of the multi-channel active pattern F1. In addition, the gate insulation layer 145 may be disposed between the normal gate 147_1 and the field insulation layer (that is, the second region 112). The gate insulation layer 145 may include a high-k material having a higher dielectric constant than a silicon oxide layer. For example, the gate insulation layer 145 may include $HfO_2$, $ZrO_2$ or $Ta_2O_5$.

Referring again to FIGS. 1 to 6, a plurality of sources/drains 161a and 162a may be disposed between the plurality of normal gates 147_1 to 147_5 and between the normal gates (e.g., 147_1 and 147_4) and the dummy gate (e.g., 247_1). In the illustrated embodiment, the sources/drains 161a and 162a are formed by doping impurities to the multi-channel active patterns F1 to F3, but aspects of the present inventive concept are not limited thereto.

Spacers 151 may include at least one of a nitride layer and an oxynitride layer. The spacers 151 may be formed on sidewalls of the plurality of plurality of multi-channel active patterns F1 to F3, the plurality of normal gates 147_1 to 147_5, and the plurality of dummy gates 247_1 and 247_2.

The substrate 101 may include one or more semiconductor materials selected from the group consisting of Si, Ge, SiGe, GaP, GaAs, SiC, SiGeC, InAs and InP. Alternatively, the substrate 101 may a silicon on insulator (SOI) substrate.

Referring to FIGS. 2 and 5, as described above, the first region 111 and the second region 112 of the field insulation layer 110 have different heights. The height of the first region 111 may be H0+H1, and the height of the second region 112 may be H0.

A top surface of at least a portion of the field insulation layer 110 (that is, the top surface of the first region 111) is higher than bottom surfaces of the normal gates 147_1 to 147_5. The normal gates 147_1 to 147_5 are formed along the top surface of the field insulation layer 110 (that is, the top surface of the second region 112) and top surfaces and side surfaces of the multi-channel active patterns F1 to F3. In the normal gates 147_1 to 147_5, the term "bottom surface" may mean the lowest parts of the bottom surfaces of the normal gates 147_1 to 147_5. In FIG. 2, the bottom surface may correspond to a part contacting the top surface of the second region 112.

In other words, the top surface of the first region 111 may be parallel with (or on the same level with) or higher than top surfaces of the sources/drains 161a and 162a. In other words, the top surface of the first region 111 may be parallel with or higher than the top surfaces of the multi-channel active patterns F1 to F3. In the illustrated embodiment, the top surface of the first region 111 is H2 higher than the top surfaces of the multi-channel active patterns F1 to F3.

In other words, heights of the dummy gates 247_1 and 247_2 are different from heights of the normal gates 147_1 to 147_5. The top surfaces of the dummy gates 247_1 and 247_2 may be parallel with the top surfaces of the normal gates 147_1 to 147_5. For example, when the dummy gates 247_1 and 247_2 and the normal gates 147_1 to 147_5 are formed through planarization, the top surfaces thereof may be parallel with each other. Therefore, when the top surface of the first region 111 is higher than the top surfaces of the multi-channel active patterns F1 to F3, the dummy gates 247_1 and 247_2 are formed on the first region 111 and the normal gates 147_1 to 147_5 are formed on the multi-channel active patterns F1 to F3. Thus, in cross-sectional views, the heights of the dummy gates 247_1 and 247_2 are lower than the heights of the normal gates 147_1 to 147_5.

The semiconductor device in some environments according to the inventive concept is shown on the left side of FIG.

7 and a conventional semiconductor device is shown on the right side of FIG. 7 for the purposes of comparison to one another.

In the conventional semiconductor device, for example, the field insulation layer 110 is not divided into a first region 111 and a second region 112 and has a constant height. Thus, in the conventional semiconductor device, the field insulation layer 110 has a height H0 between the first multi-channel active pattern F1 and the second multi-channel active pattern F2. In addition, in the conventional semiconductor device, a dummy gate 1247_1 is also disposed in a space between the first multi-channel active pattern F1 and the second multi-channel active pattern F2. Thus, parasitic capacitance C11 formed between the dummy gate 1247_1 and the first multi-channel active pattern F1 and parasitic capacitance C12 formed between the dummy gate 1247_1 and the second multi-channel active pattern F2 are relatively large. The parasitic capacitance C11 and C12 may adversely affect the operating characteristics of the conventional semiconductor device. For example, the parasitic capacitance C11 and C12 may increase a delay time in operating the semiconductor device. In addition, since there are considerably large contact areas between the dummy gate 1247 and the first multi-channel active pattern F1 and between the dummy gate 1247_1 and the second multi-channel active pattern F2, an amount of leakage current may be large.

In comparison, in the semiconductor device in some embodiments according to the inventive concept, since the top surface of the first region 111 is parallel with (or on the same level with) or higher than the top surfaces of the multi-channel active patterns F1 and F2, the lowest portion of the dummy gate 247_1 is not disposed in the space between the first multi-channel active pattern F1 and the second multi-channel active pattern F2. Thus, the parasitic capacitance C1 (formed between the dummy gate 247_1 and the first multi-channel active pattern F1) and parasitic capacitance C2 (formed between the dummy gate 247_1 and the second multi-channel active pattern F2) are relatively small. In addition, since there is little contact area between the dummy gate 247 and the first multi-channel active pattern F1 or between the dummy gate 247_1 and the second multi-channel active pattern F2, an amount of leakage current may be small.

Figure 8A:
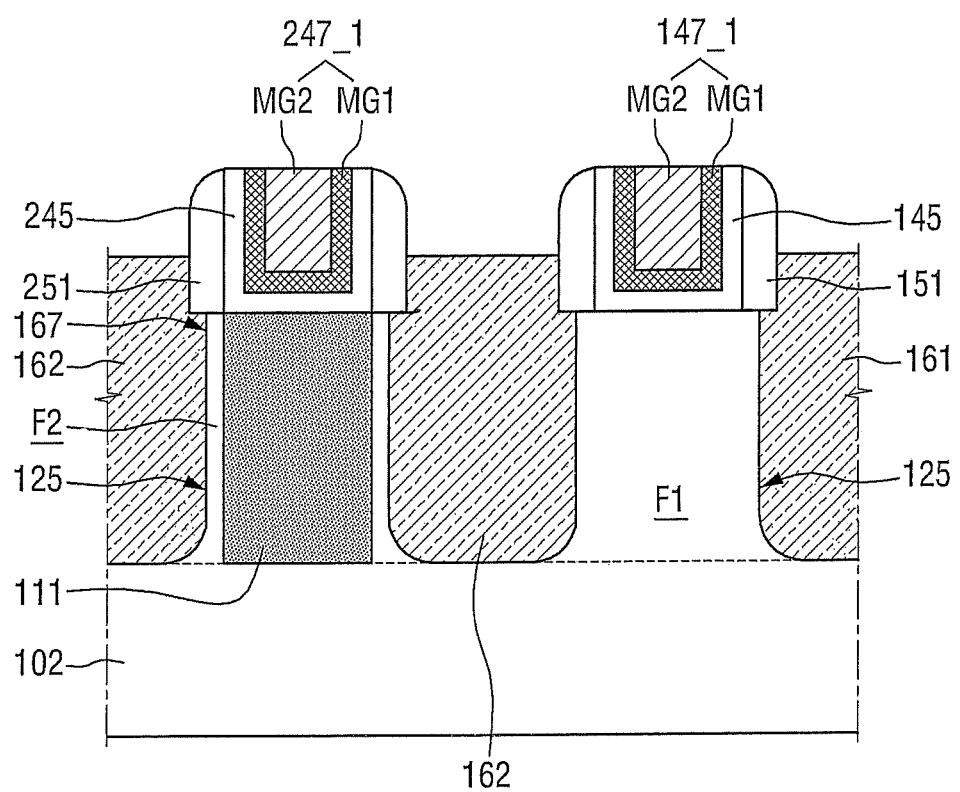
FIG. 8A is a cross-sectional view of a semiconductor device according to some embodiments of the present inventive concept.
Figure 8B:
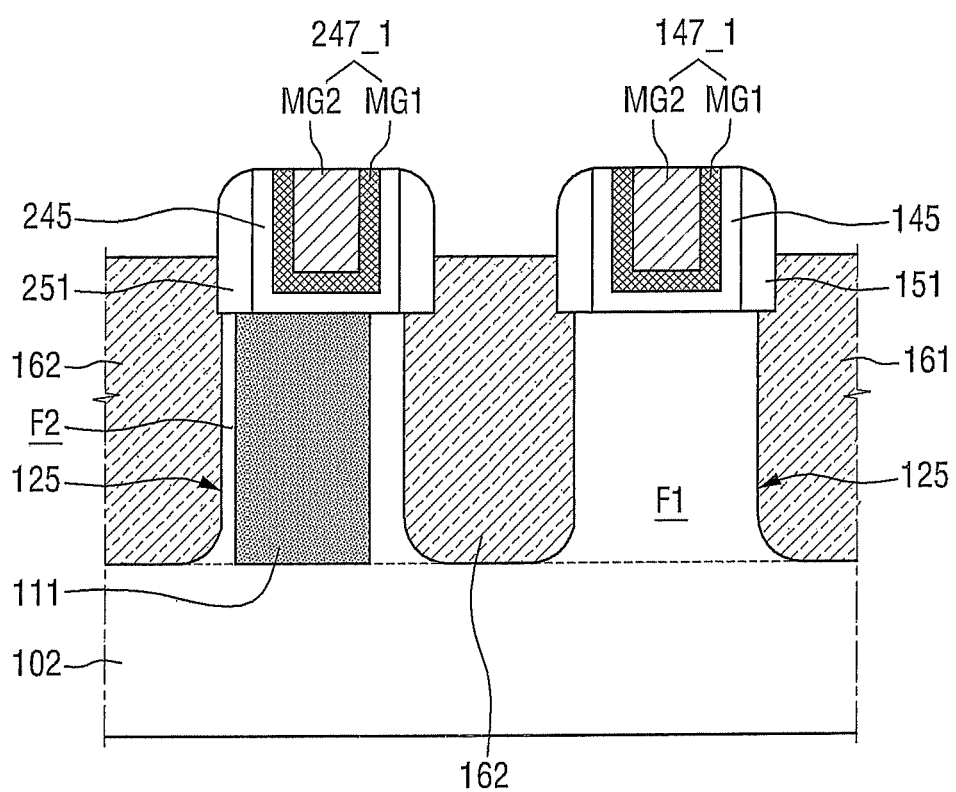
FIG. 8B is a cross-sectional view of a semiconductor device according to some embodiments of the present inventive concept.

FIG. 8A is a cross-sectional view of a semiconductor device according to an embodiment of the present inventive concept, and FIG. 8B is a cross-sectional view of a semiconductor device according to an embodiment of the present inventive concept. Referring to FIG. 8A, recesses 125 may be formed between a plurality of normal gates 147_1 to 147_5 and in a plurality of multi-channel active patterns F1 to F3 between the normal gates 147_1 to 147_5 and dummy gates 247_1 and 247_2.

Sources/drains 161 and 162 are formed in the recesses 125. Each of the sources/drains 161 and 162 may include an epitaxial layer. That is to say, the sources/drains 161 and 162 may be formed by epitaxial growth. In addition, the sources/drains 161 and 162 may be elevated sources/drains protruding relative to the multi-channel active patterns F1 to F3.

As shown FIG. 8A, parts of the sources/drains 161 and 162 may overlap with the spacers 151 and 251. That is to say, the parts of the sources/drains 161 and 162 may tucked under lower portions of the spacers 151 and 251, as labeled 167.

In a case where the semiconductor device is a PMOS transistor, the sources/drains 161 and 162 may include a compressive stress material. For example, the compressive stress material may be a material having a larger lattice constant than silicon (Si), for example, SiGe. The compressive stress material may improve the mobility of carriers (holes) of a channel region by applying compressive stress to a multi-channel active pattern (e.g., F1).

However, in a case where the semiconductor device is an NMOS transistor, the sources/drains 161 and 162 may include the same material as the substrate 101 or a tensile stress material. For example, when substrate 101 includes Si, the sources/drains 161 and 162 may include Si or a material having a smaller lattice constant than Si (e.g., SiC).

A top surface of the field insulation layer 111 may be parallel with a top surface of the multi-channel active pattern F1.

FIG. 8B illustrates that the dummy gate 247_1 and the field insulation layer 111 are misaligned. According to FIG. 8B, when the dummy gate 247_1 and the field insulation layer 111 are misaligned, a portion of the dummy gate 247_1 can overlap with the top surface of the multi-channel active pattern F1.

Figure 8C:
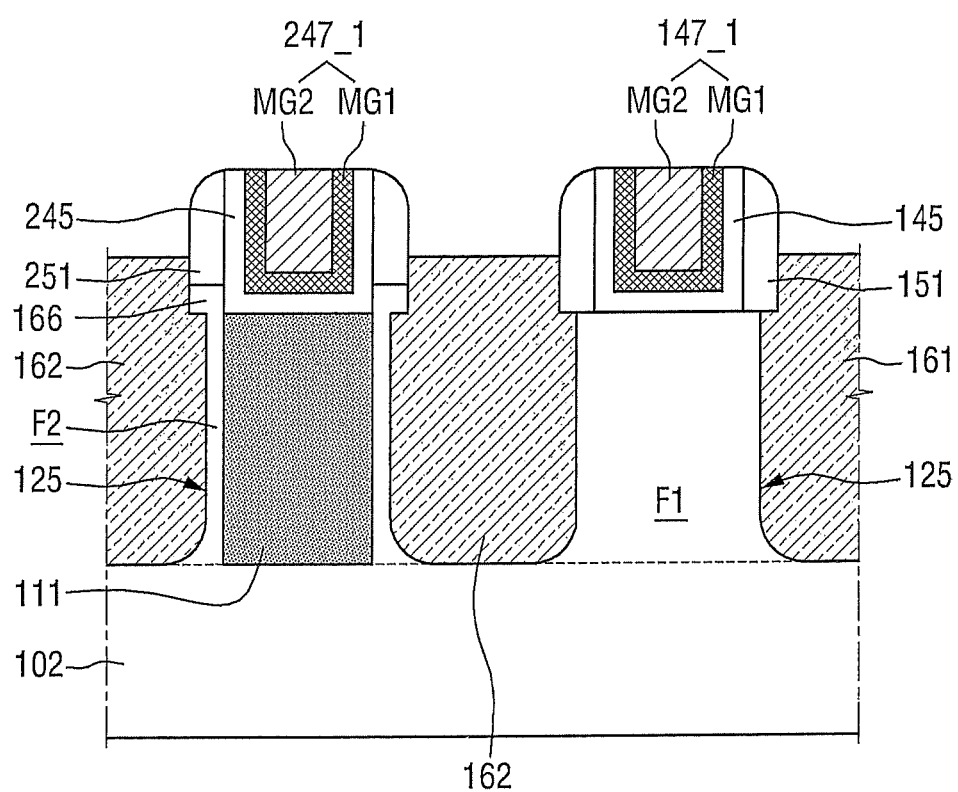
FIG. 8C is a cross-sectional view of a semiconductor device according to some embodiments of the present inventive concept.

FIG. 8C is a cross-sectional view of a semiconductor device according to an embodiment of the present inventive concept.

Referring to FIG. 8C, a portion of the elevated source/drain 162 may overlap with the spacer 245. A semiconductor part 166 may be positioned between a region of the elevated source/drain 162 overlapping with the spacer 245 and the spacer 245.

Figure 25A:
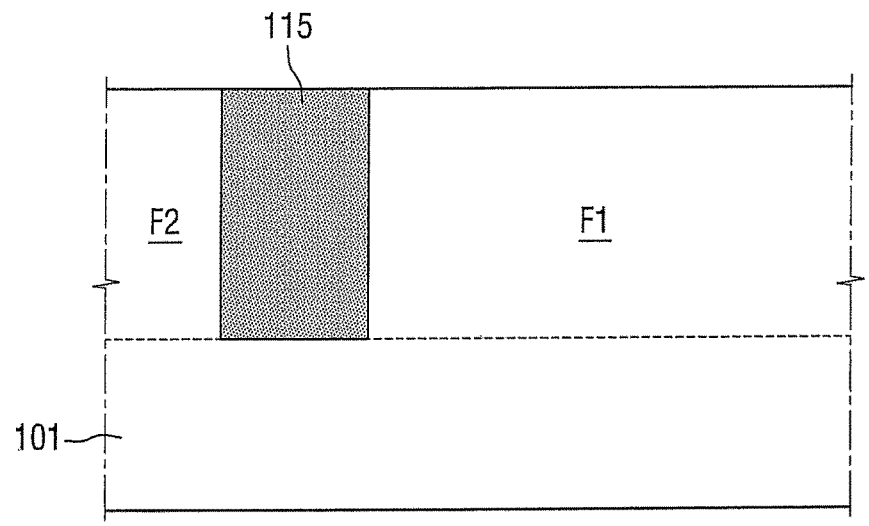
FIGS. 25A and 25B illustrate intermediate structures provided via methods of forming the semiconductor device according to FIG. 8A.
Figure 25B:
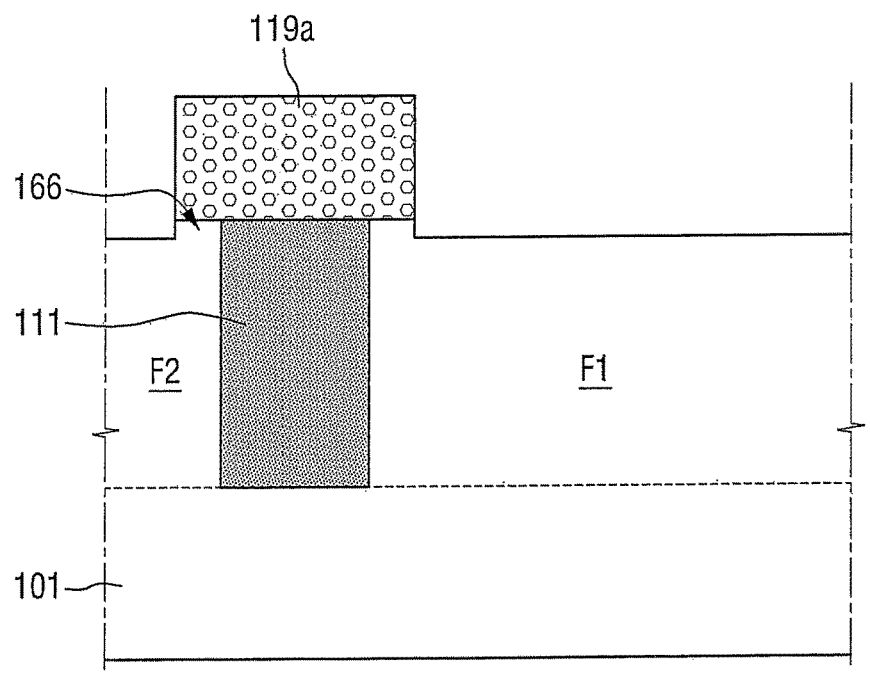

The semiconductor part 166 is a region that is not etched because it is covered by a mask 119a, (described, for example, with reference to FIG. 25B). The semiconductor part 166 may facilitate particularly shaped epitaxial growth when the elevated source/drain 162 is formed in a later step.

Figure 8D:
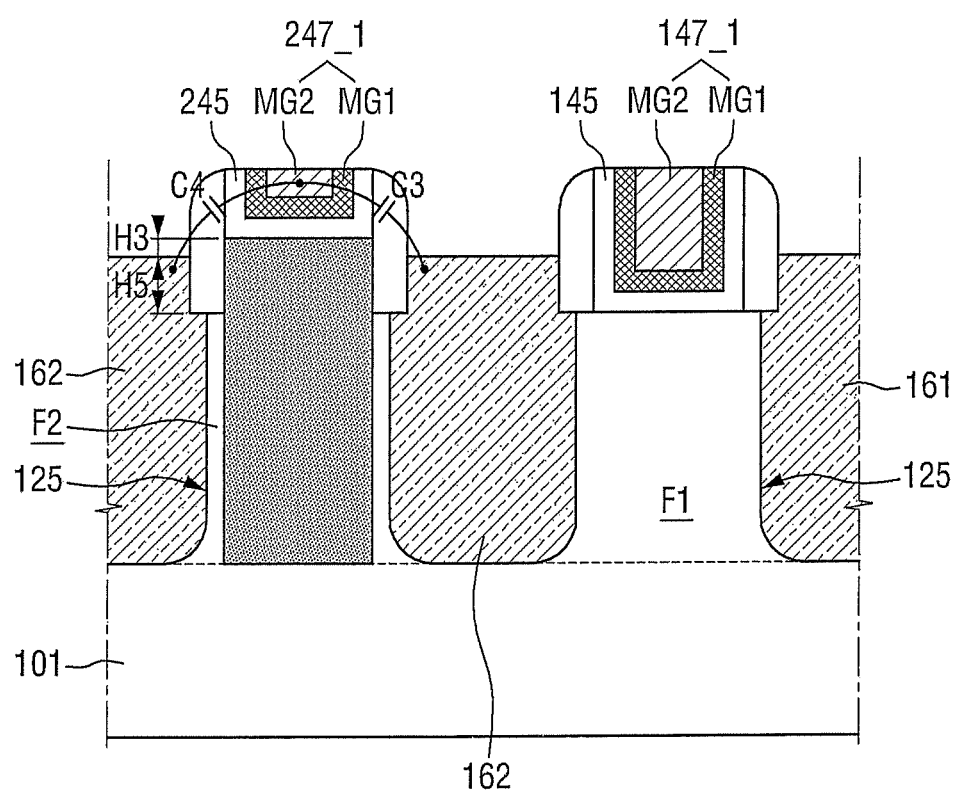
FIG. 8D is a cross-sectional view of a semiconductor device according to some embodiments of the present inventive concept.

FIG. 8D is a cross-sectional view of a semiconductor device according to an embodiment of the present inventive concept. Referring to FIG. 8D, in the semiconductor device according to the embodiment of the present inventive concept, sources/drains 161 and 162 may be elevated sources/drains. Top surfaces of the sources/drains 161 and 162 may be H5 higher than top surfaces of the multi-channel active patterns F1 to F3. In addition, the sources/drains 161 and 162 and a normal gate 147 may be insulated from each other by spacers 151.

A height of the source/drain 161 disposed between the plurality of normal gates 147_1 to 147_5 and a height of the source/drain 162 disposed between the normal gates 147_1 to 147_5 and the dummy gates 247_1 and 247_2 are equal to each other. It will be understood that, the term "the heights of the source/drain 161 and the source/drain 162 are equal to each other" is defined to include process errors.

In the semiconductor device according to the embodiment of the present inventive concept, as shown in FIG. 8D, a top surface of at least a portion of the field insulation layer 110 (e.g., a top surface of the first region 111) may be parallel with or higher than top surfaces of the elevated sources/drains 161 and 162. In the illustrated embodiment, the top surface of at least a portion of the field insulation layer 110 (e.g., the top surface of the first region 111) is H3 higher than the top surfaces of the elevated sources/drains 161 and 162. Thus, parasitic capacitances C3 and C4 formed between the dummy gates 247_1 and 247_2 and the elevated source/drain 162 can be small. In addition, since there is little contact area between each of the dummy gates 247_1 and 247_2 and the elevated source/drain 162, an amount of leakage current can be small.

Heights of the dummy gates 247_1 and 247_2 and heights of the normal gates 147_1 to 147_5 are different from each other. The heights of the dummy gates 247_1 and 247_2 may be smaller than the heights of the normal gates 147_1 to 147_5.

Figure 9A:
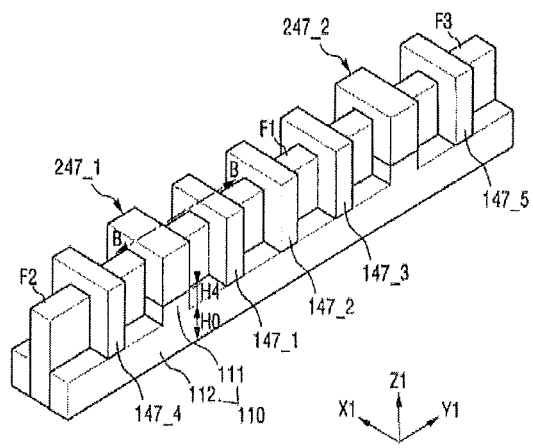
FIG. 9A is a perspective view of a semiconductor device according to some embodiments of the present inventive concept.
Figure 9B:
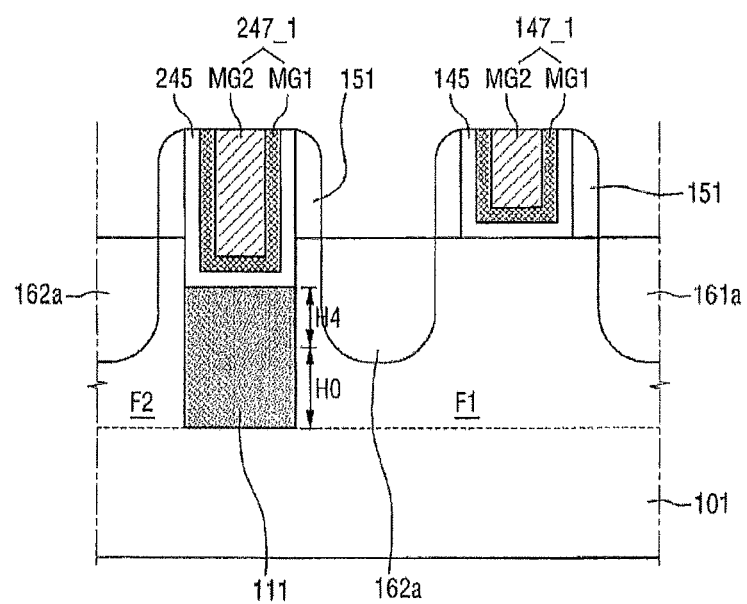
FIG. 9B is a cross-sectional view taken along the line B-B of FIG. 9A.

FIG. 9A is a perspective view of a semiconductor device according to some embodiments of the present inventive concept, and FIG. 9B is a cross-sectional view taken along the line B-B of FIG. 9A. Referring to FIGS. 9A and 9B, a field insulation layer 110 may include a first region 111 and a second region 112 having different heights. The height of the second region 112 may be H0 and the height of the first region 111 may be H0+H4. The height of the first region 111, H0+H4, may be smaller than the height of the first region 111 shown in FIG. 2, H0+H1.

Heights of the dummy gates 247_1 and 247_2 and heights of the normal gates 147_1 to 147_5 may be different from each other. The heights of the dummy gates 247_1 and 247_2 may be greater than the heights of the normal gates 147_1 to 147_5.

The parasitic capacitance of the semiconductor device shown in FIGS. 9 and 9B may be greater than the parasitic capacitance (C1, C2 of FIG. 7) of the semiconductor device shown in FIG. 7. However, the parasitic capacitance of the semiconductor device shown in FIGS. 9A and 9B may still be smaller than the parasitic capacitance (C11, C12 of FIG. 7) associated with the conventional approach. Sources/drains 161a and 162a may be elevated sources/drains.

Figure 10A:
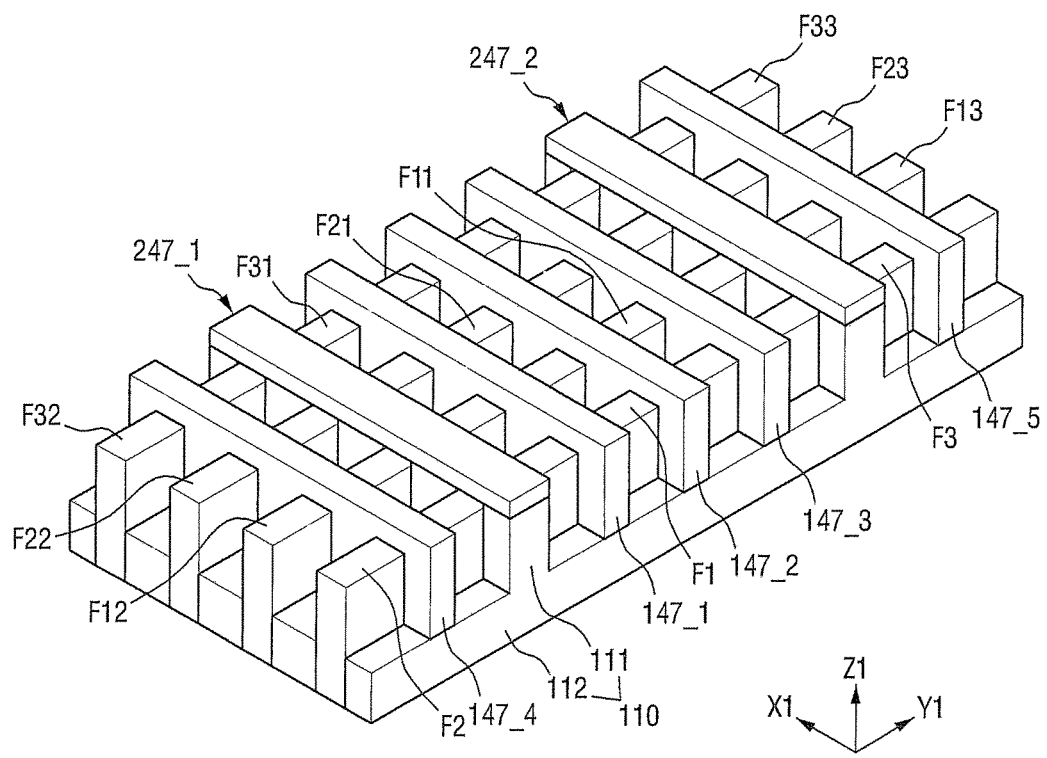
FIG. 10A is a perspective view of a semiconductor device according to some embodiments of the present inventive concept.
Figure 10B:
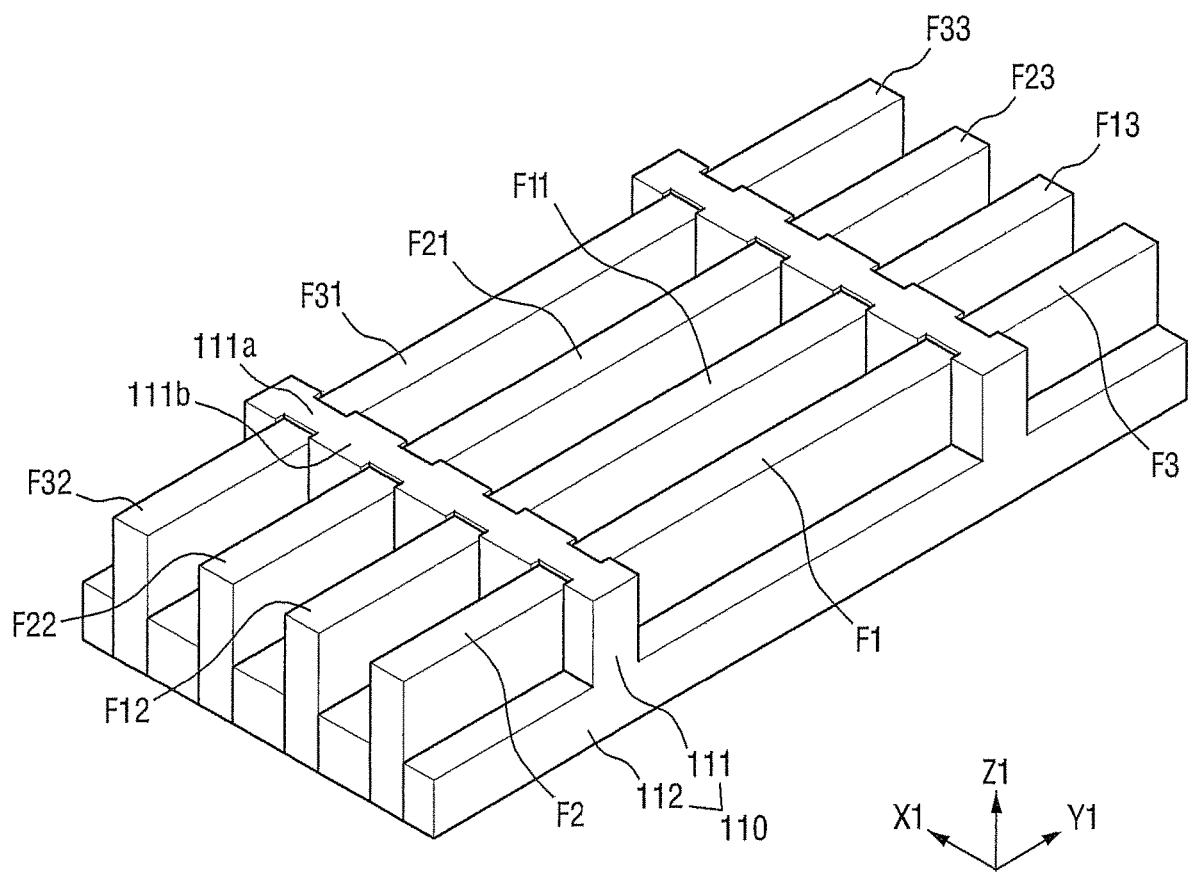
FIG. 10B is a partially perspective view illustrating multi-channel active patterns and a field insulation layer of the semiconductor device shown in FIG. 10A.

FIG. 10A is a perspective view of a semiconductor device according to some embodiments of the present inventive concept, FIG. 10B is a partially perspective view illustrating multi-channel active patterns and a field insulation layer of the semiconductor device shown in FIG. 10A. Referring to FIGS. 10A and 10B, the plurality of multi-channel active patterns F1 to F3, F11 to F13, F21 to F23 and F31 to F33 are arranged as shown in X1 and Y1 directions. That is to say, the multi-channel active patterns F1 to F3, F11 to F13, F21 to F23 and F31 to F33 are arranged such that long sides thereof face each other. In detail, the first multi-channel active pattern F1 and the multi-channel active patterns F11, F21 and F31 are arranged abreast of each other in lateral directions. The second multi-channel active pattern F2 and the multi-channel active patterns F12, F22 and F32 are arranged abreast of each other in lateral directions. The third multi-channel active pattern F3 and the multi-channel active patterns F13, F23 and F33 are arranged abreast of each other in lateral directions.

The field insulation layer 110 may include a first region 111 and a second region 112 having different heights. The first region 111 is formed to contact short sides of the multi-channel active patterns F1 to F3, F11 to F13, F21 to F23 and F31 to F33, and the second region 112 is formed to contact long sides of the multi-channel active patterns F1 to F3, F11 to F13, F21 to F23 and F31 to F33.

The first region 111 of the field insulation layer 110 may be shaped of a fishbone antenna. In detail, the fishbone antenna includes a transmission line corresponding to a main bone passing through the entire fishbone antenna, and a plurality of dipoles corresponding to bones branched off to either side from the main bone In other words, a fishbone antenna is constructed such that a plurality of dipoles are arranged at regular intervals along a lengthwise direction of a transmission line and with respect to the transmission line extending in a lengthwise direction of the fishbone antenna.

Therefore, the field insulation layer 110 may include a first part 111a (a center axis region) extending in a first direction X1 and a plurality of second parts 111b (projecting regions) branched off to either side of the first part 111a. The first part of 111a may include opposing notches on opposite sides of the protruding portion 111 that are configured to allow the fins on either side to be recessed within the notches.

The plurality of second parts 111b (projecting regions) may be formed to surround end portions of the plurality of multi-channel active patterns F1 to F3, F11 to F13, F21 to F23 and F31 to F33.

The plurality of normal gates 147_1 to 147_5 may be formed on the corresponding multi-channel active patterns F1 to F3, F11 to F13, F21 to F23 and F31 to F33 to cross the corresponding multi-channel active patterns F1 to F3, F11 to F13, F21 to F23 and F31 to F33. For example, first to third normal gates 147_1, 147_2 and 147_3 may be formed on the multi-channel active patterns F1, F11, F21 and F31, a fourth normal gate 147_4 may be formed on the multi-channel active patterns F2, F12, F22 and F32, and a fifth normal gate 147_5 may be formed on the multi-channel active patterns F3, F13, F23 and F33.

The plurality of dummy gates 247_1 and 247_2 may be formed on the corresponding field insulation layer 110 (that is, the first region 111).

Figure 11:
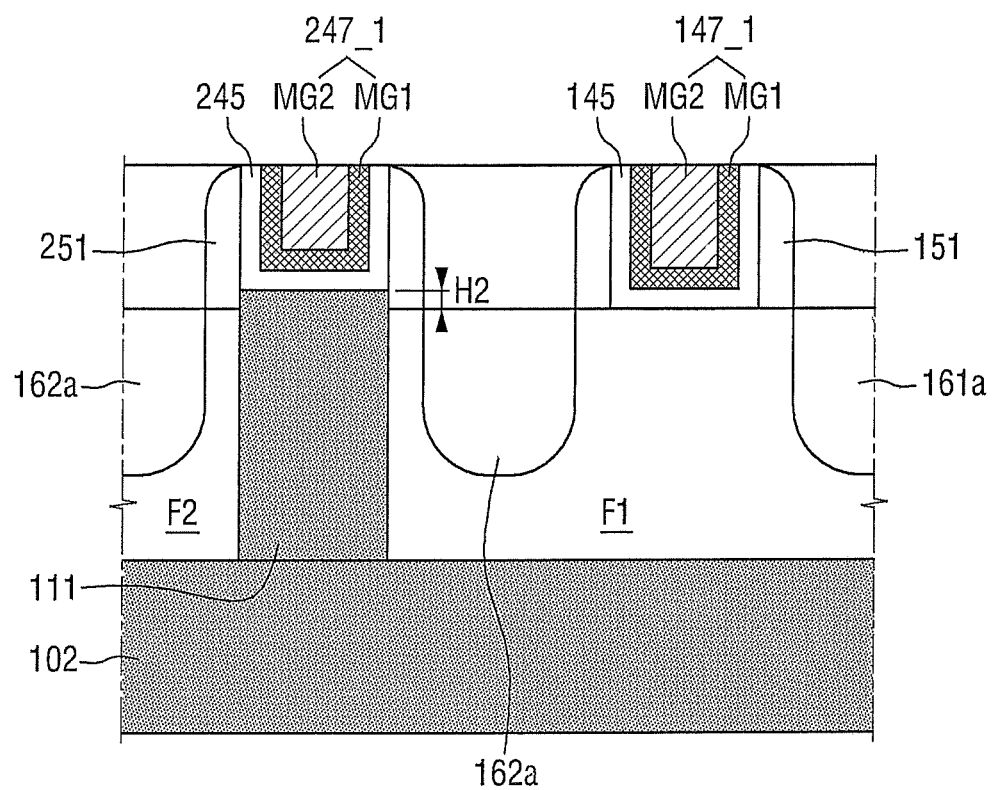
FIG. 11 is a cross-sectional view of a semiconductor device according to some embodiments of the present inventive concept.

FIG. 11 is a cross-sectional view of a semiconductor device according to some embodiments of the present inventive concept. Referring to FIG. 11, a silicon on insulator (SOI) substrate may be used. That is to say, single crystalline silicon is formed on a buried oxide layer 102, and a plurality of multi-channel active patterns F1 to F3 may be formed using the single crystalline silicon. The buried oxide layer 102 and the field insulation layer 101 may be disposed to make contact with each other. The use of the SOI substrate may further reduce a delay time in operating the semiconductor devices. Sources/drains 161a and 162 a may be elevated sources/drains.

Figure 12:
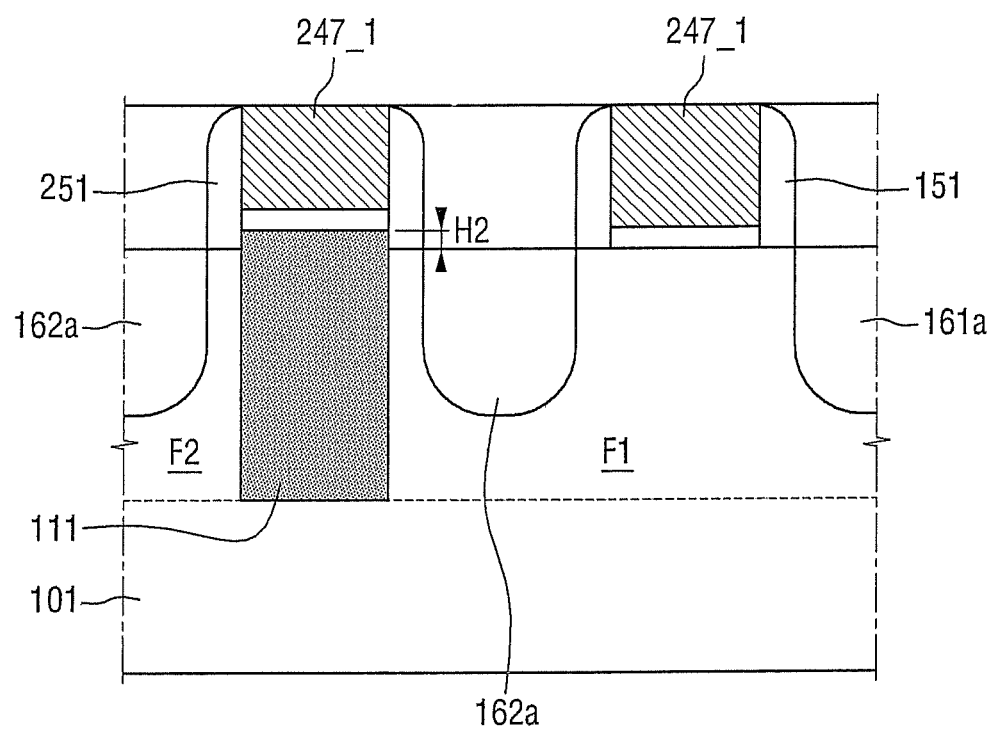
FIG. 12 is a cross-sectional view of a semiconductor device according to some embodiments of the present inventive concept.

FIG. 12 is a cross-sectional view of a semiconductor device according to some embodiments of the present inventive concept. Referring to FIG. 12, a normal gate 147_1 and a dummy gate 247_1 may be formed using a gate first process, without using a gate last process. In the illustrated embodiment, the normal gate 147_1 and the dummy gate 247_1 are made of Si or SiGe, rather than a metal, but aspects of the present inventive concept are not limited thereto. Sources/drains 161a and 162a may be elevated sources/drains.

Figure 13:
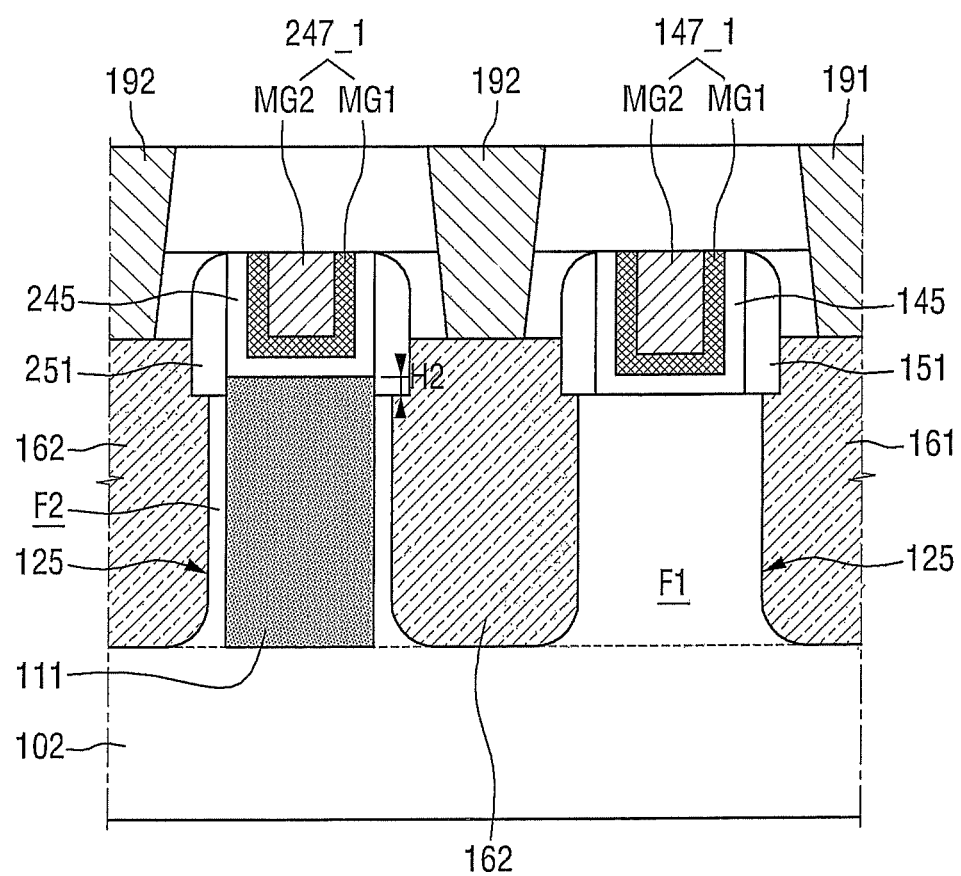
FIG. 13 is a cross-sectional view of a semiconductor device according to some embodiments of the present inventive concept.

FIG. 13 is a cross-sectional view of a semiconductor device according to some embodiments of the present inventive concept. Referring to FIG. 13, a plurality of contacts 191 and 192 may have the same height. It will be understood that the term "the plurality of contacts 191 and 192 have the same height" is defined to include process errors.

The plurality of sources/drains 161 and 162 may be elevated sources/drains. A height of the source/drain 161 disposed between a plurality of normal gates 147_1 to 147_5 and a height of the source/drain 162 disposed between the normal gates 147_1 to 147_5 and dummy gates 247_1 and 247_2 are equal to each other. Thus, a contact 191 formed on the source/drain 161 and a contact 192 formed on the source/drain 162 may have substantially the same height.

Figure 14A:
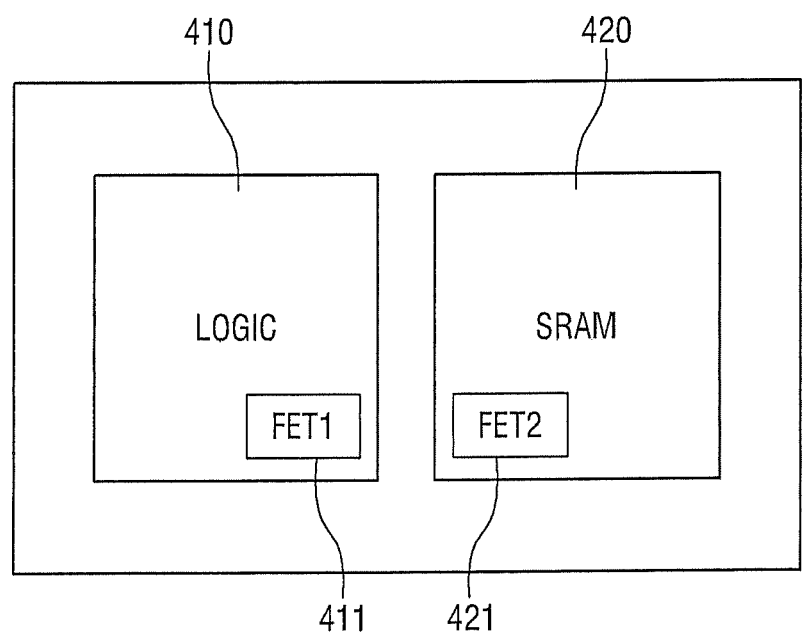
FIG. 14A is a block diagram of a semiconductor device according to some embodiments of the present inventive concept.
Figure 14B:
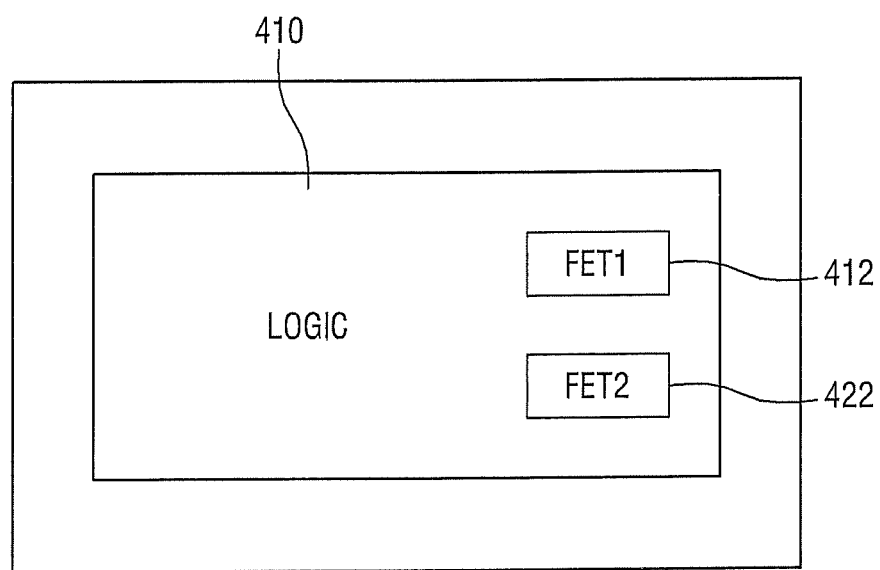
FIG. 14B is a block diagram of a semiconductor device according to some embodiments of the present inventive concept.

FIG. 14A is a block diagram of a semiconductor device according to some embodiments of the present inventive concept, and FIG. 14B is a block diagram of a semiconductor device according to some embodiments of the present inventive concept. Referring to FIG. 14A, a multi gate transistor 411 may be disposed in a logic area 410, and a multi gate transistor 421 may be disposed in an SRAM area 420.

Referring to FIG. 14B, different multi gate transistors 412 and 422 may be disposed in a logic area 410. Different multi gate transistors may also be disposed in an SRAM area. The multi gate transistor 411 may be any of the semiconductor devices shown in FIGS. 1-13 according to some embodiments of the present inventive concept, and the multi gate transistor 412 may also be any of the semiconductor devices shown in FIGS. 1-13 according to the embodiments of the present inventive concept. For example, the multi gate transistor 411 may be the semiconductor device shown in FIG. 5, the multi gate transistor 412 may be the semiconductor device shown in FIGS. 9A and 9B, the multi gate transistor 411 may be each of the semiconductor devices shown in FIGS. 8A to 8D, and the multi gate transistor 412 may be the semiconductor device shown in FIG. 12.

In FIG. 14A, the logic area 410 and the SRAM area 420 are examples, but aspects of the present inventive concept are not limited thereto. For example, the present inventive concept may also be applied to the logic area 410 and an area for another type of memory (e.g., DRAM, MRAM, RRAM, or PRAM).

Figure 15A:
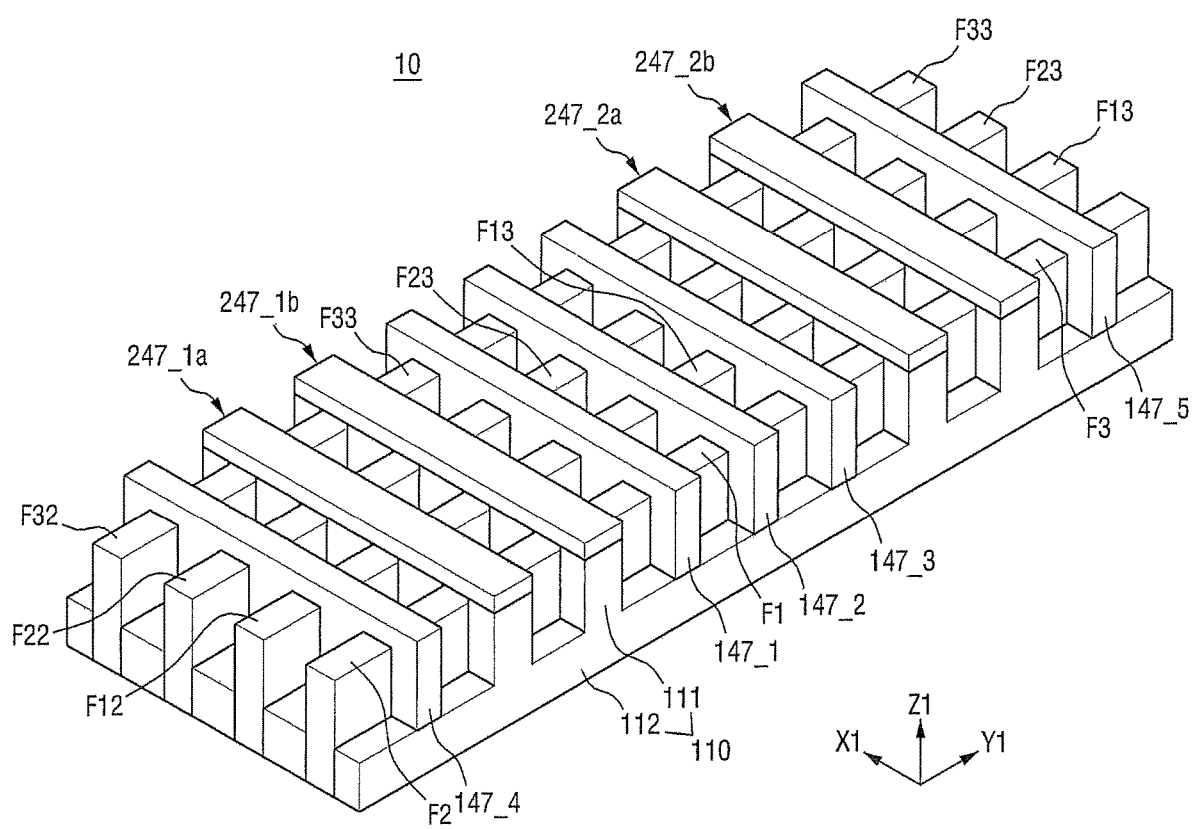
FIG. 15A is a perspective view of a semiconductor device according to some embodiments of the present inventive concept.

FIG. 15A is a perspective diagram of a semiconductor device according to some embodiments of the present inventive concept. Referring to FIG. 15A, a plurality of dummy gates 247_1a, 247_1b, 247_2a, and 247_2b may be disposed between each of multi-channel active patterns F1 to F3. In the illustrated embodiment, each two dummy gates 247_1a and 247_1b, and 247_2a and 247_2b are examples, but aspects of the present inventive concept are not limited thereto.

Each of the dummy gates 247_1a, 247_1b, 247_2a and 247_2b may be formed on each of field insulation layers 111 separated from each other, but aspects of the present inventive concept are not limited thereto. For example, the dummy gates 247_1a and 247_1b may be formed on one field insulation layer 111, and the dummy gates 247_2a and 247_2b may be formed on the other field insulation layer 111.

Figure 15B:
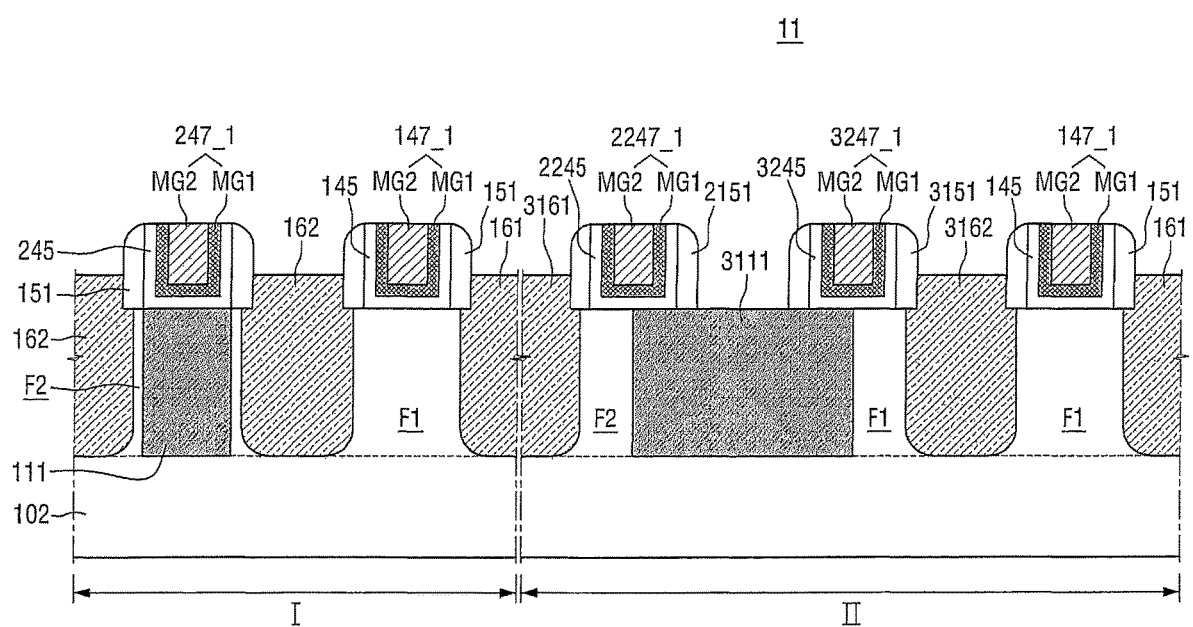
FIG. 15B is a cross-sectional view of a semiconductor device according to some embodiments of the present inventive concept.

FIG. 15B is a cross-section diagram of a semiconductor device according to some embodiments of the present inventive concept. Referring to FIG. 15B, the semiconductor device may include a first region I and a second region II. Any of the semiconductor devices shown in FIGS. 1-13 according to the embodiments of the present inventive concept may be formed on the first region I. In the illustrated embodiment of the present inventive concept, the semiconductor device is exemplified in FIG. 15B.

On the second region II, a plurality of dummy gates 2247_1 and 3247_1 may be disposed between the first multi-channel active pattern F1 and the second multi-channel active pattern F2. In the illustrated embodiment, two dummy gates 2247_1 and 3247_1 are exemplified, but aspects of the present inventive concept are not limited thereto. The dummy gates 2247_1 and 3247_1 are formed a field insulation layer 3111. Spacers 2151 and 3151 may be formed on sidewalls of the dummy gates 2247_1 and 3247_1, respectively. In detail, part of the dummy gate 2247_1 or part of the spacer 2151 may overlap with one side of the field insulation layer 3111. In addition, the part of the dummy gate 2247_1 or the part of the spacer 2151 may overlap with the other side of the field insulation layer 3111. A source/drain 3162 may be disposed between the dummy gates 2247_1 and 3247_1 and a normal gate 147_1. The source/drain 3162 may be an elevated source/drain.

Here, the first region I and the second region II are not limited to particular regions. The second region II may be a relatively wide space, and the first region I may be a space smaller than the second region II.

Hereinafter, methods of forming the semiconductor device illustrated in FIGS. 1-5 are described with reference to FIGS. 16 to 24. FIGS. 17 and 18 are cross-sectional views taken along lines A-A and B-B of FIG. 16, FIGS. 20 and 21 are cross-sectional views taken along lines A-A and B-B of FIG. 19, and FIGS. 23 and 24 are cross-sectional views taken along lines A-A and B-B of FIG. 22.

Figure 16:
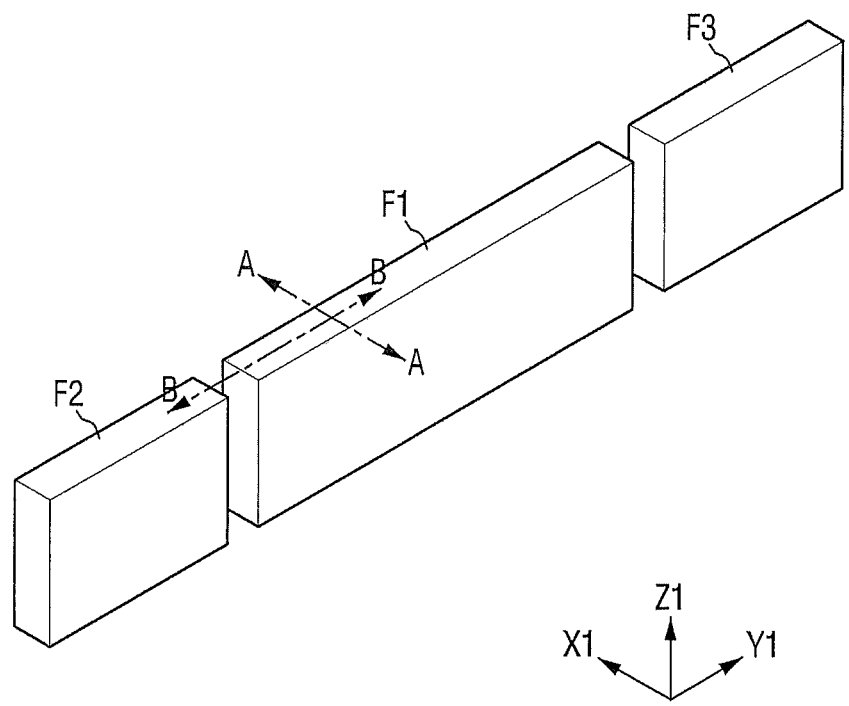
FIGS. 16 to 24 illustrate methods of forming the semiconductor device according to FIGS. 1-6.
Figure 17:
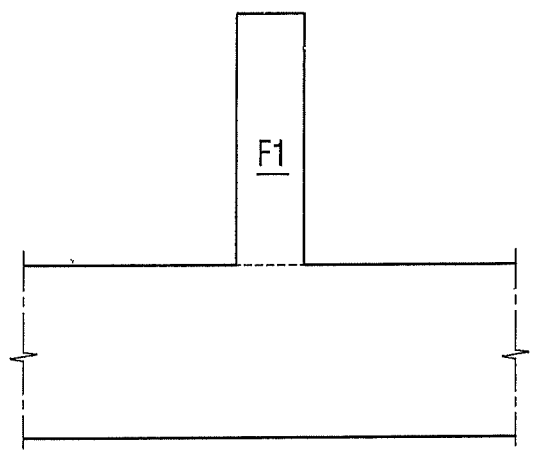
Figure 18:
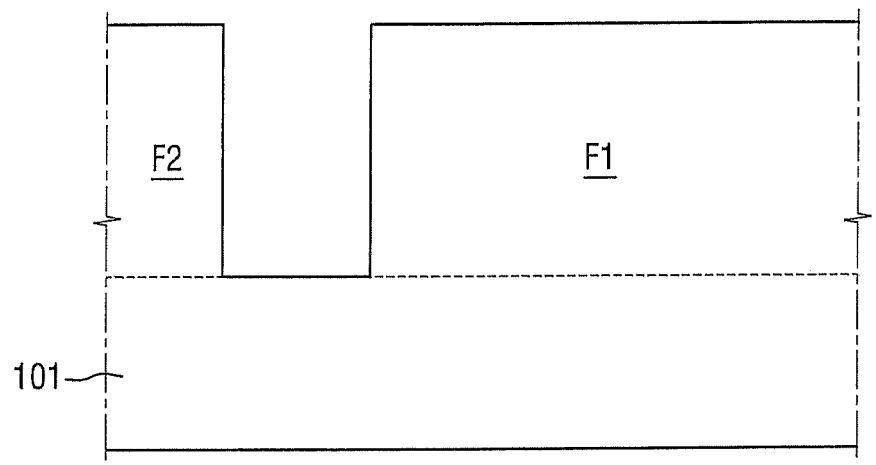

Referring to FIGS. 16 to 18, multi-channel active patterns F1 to F3 are formed on a substrate 101. The plurality of multi-channel active patterns F1 to F3 may extend in a second direction Y1. The multi-channel active patterns F1 to F3 may parts of the substrate 101 and may include an epitaxial layer grown from the substrate 101. The multi-channel active patterns F1 to F3 may be shaped of a rectangular parallelepiped. The multi-channel active patterns F1 to F3 Since the multi-channel active patterns F1 to F3 may include long sides formed along the second direction Y1 and short sides formed along the first direction X1. Here, the multi-channel active patterns F1 to F3 may be fin-shaped or nanowire-shaped. In the illustrated embodiment, fin-shaped multi-channel active patterns F1 to F3 are exemplified.

Figure 19:
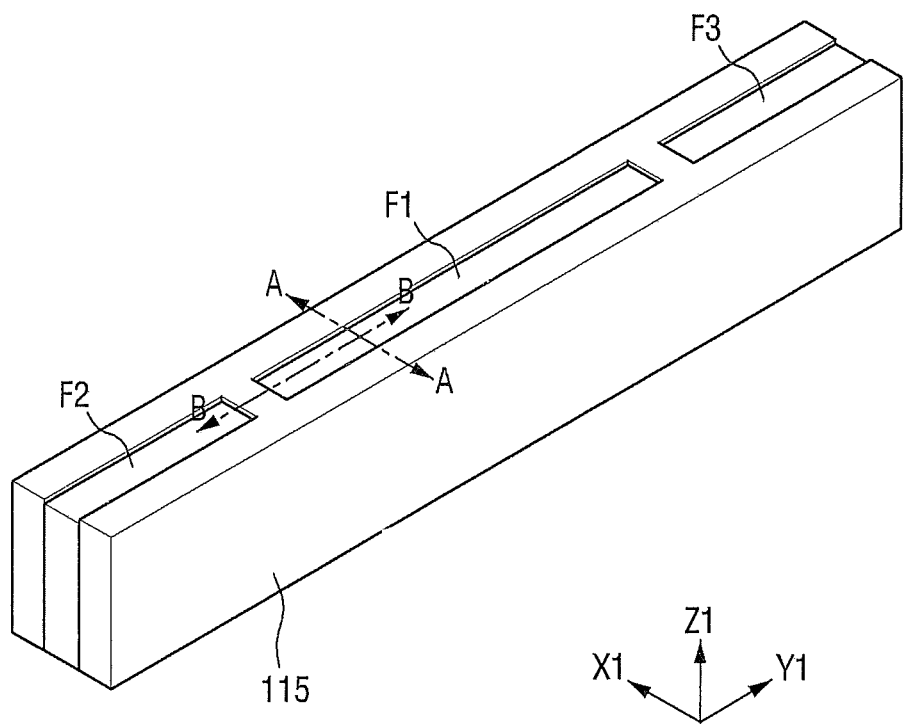
Figure 20:
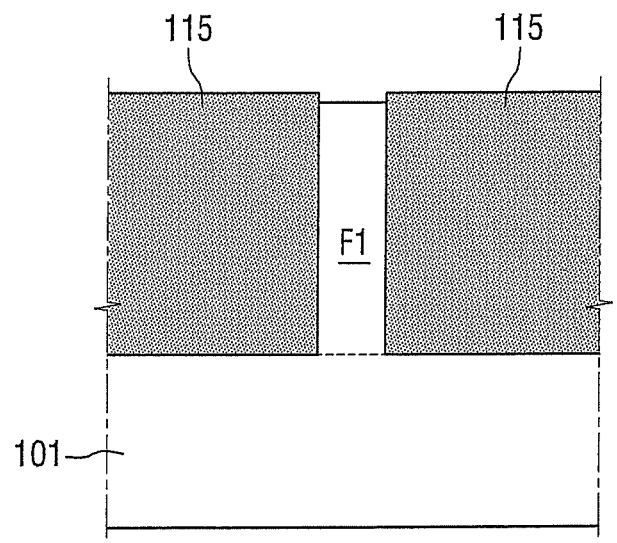
Figure 21:
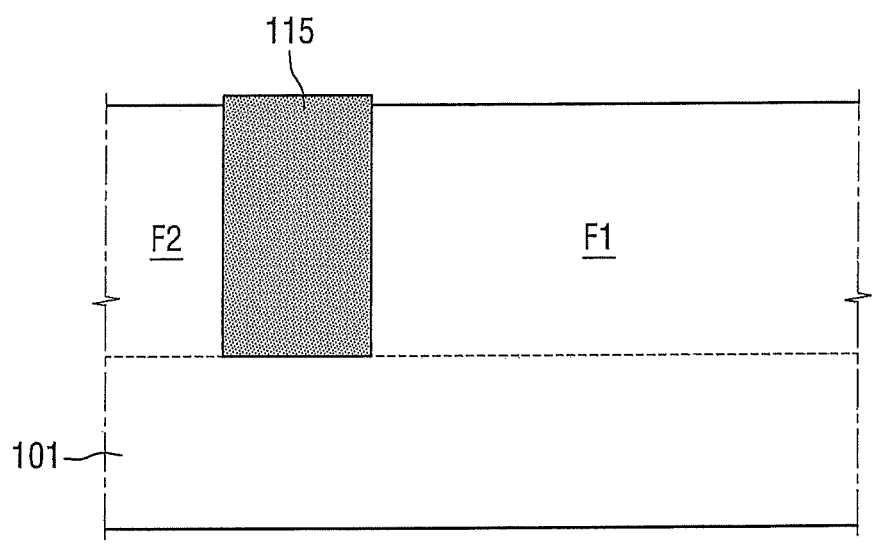

Referring to FIGS. 19 to 21, an insulation layer 115 is formed on the substrate 101. The insulation layer 115 is a potential layer to become the field insulation layer 110 during an etching process. The insulation layer 115 may be formed to surround the plurality of multi-channel active patterns F1 to F3. As shown, the insulation layer 115 may fill spaces between the first to third multi-channel active patterns F1 to F3 arranged abreast of each other in a lengthwise direction and may be formed to contact sidewalls of the first to third multi-channel active patterns F1 to F3. In particular, a top surface of the insulation layer 115 may be parallel with or higher than top surfaces of the multi-channel active patterns F1 to F3.

Figure 22:
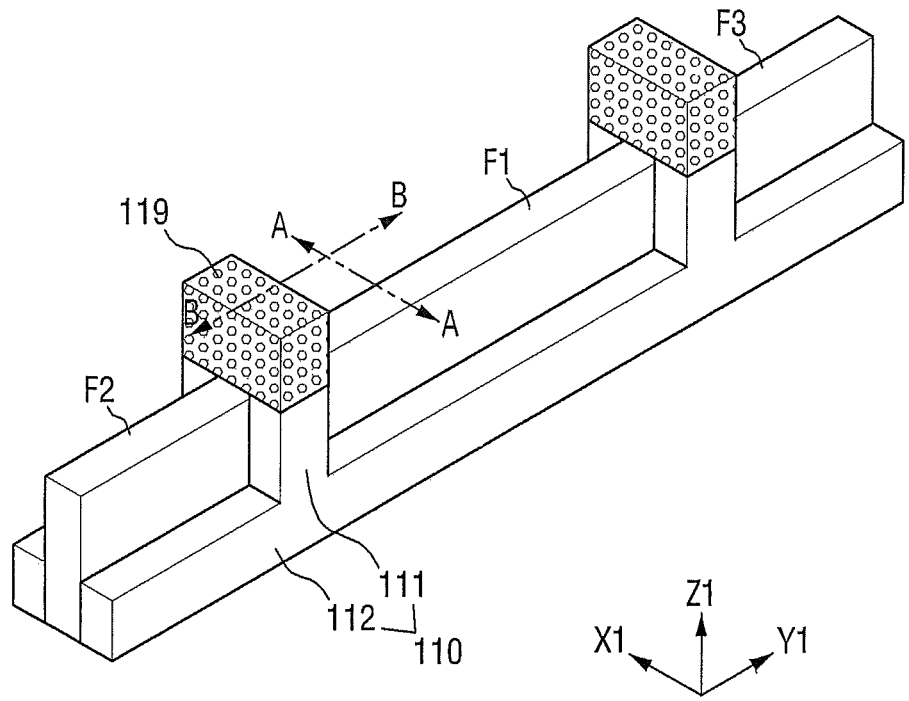
Figure 23:
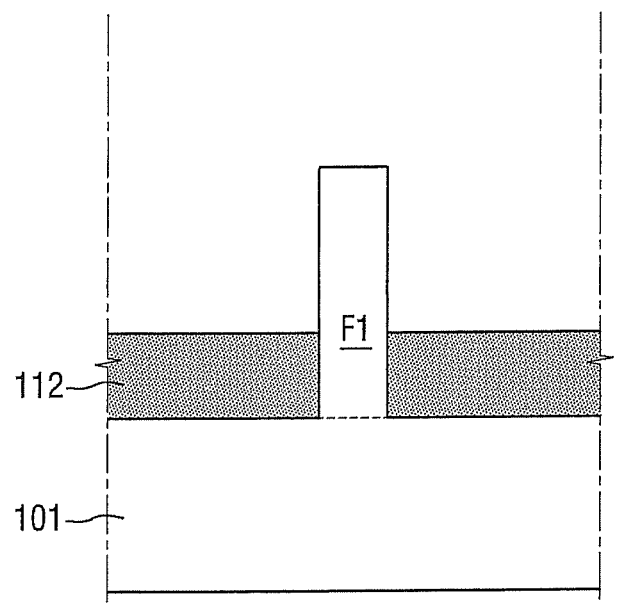
Figure 24:
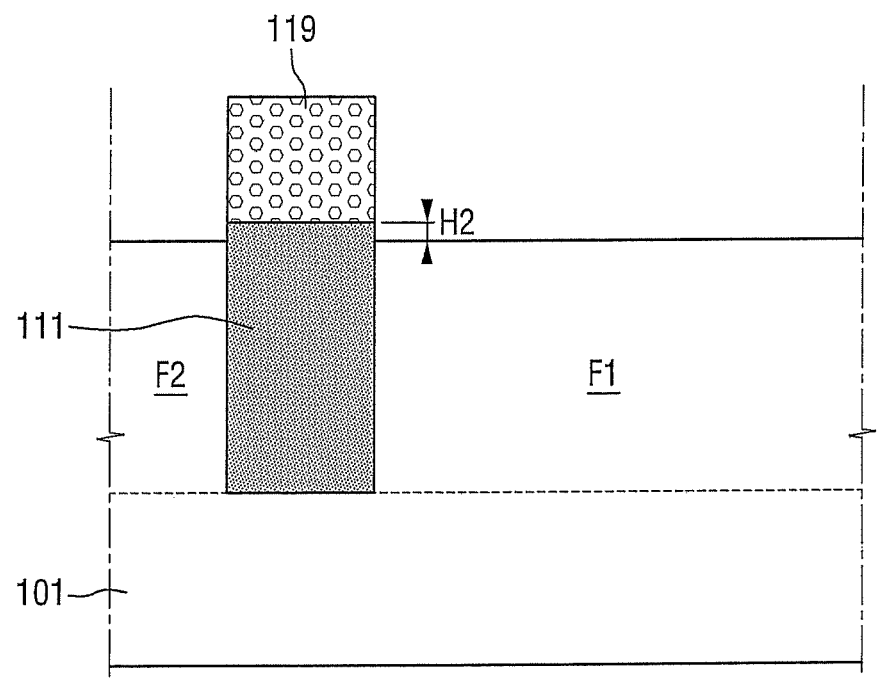

Referring to FIGS. 22 to 24, a mask 119 is formed on the plurality of multi-channel active patterns F1 to F3 and the insulation layer 115, and the insulation layer 115 is patterned using the mask 119, thereby completing the field insulation layer 110. The completed field insulation layer 110 includes a first region 111 and a second region 112 having different heights, and the first region 111 contacts short sides of the multi-channel active patterns F1 to F3, and the second region 112 contacts long sides of the multi-channel active patterns F1 to F3.

The top surface of the first region 111 may be parallel with or higher than the top surfaces of the multi-channel active patterns F1 to F3. In addition, the first region 111 may be formed to surround end portions of the multi-channel active patterns F1 to F3.

Referring to FIGS. 2 to 5, a plurality of normal gates 147_1 to 147_5 and a plurality of dummy gates 247_1 and 247_2 are formed on the substrate 101. Next, sources/drains 161a and 162a are formed at opposite sides of the normal gates 147_1 to 147_5. The normal gates 147_1 to 147_5 are formed to cross the multi-channel active patterns F1 to F3, and the dummy gates 247_1 and 247_2 are formed on the first region 111 of the field insulation layer 110. The top surface of the first region 111 may be higher than bottom surfaces of the first normal gates 147_1 to 147_5. The top surface of the first region 111 may be higher than top surfaces of the sources/drains 161a and 162a.

FIGS. 25A and 25B illustrate methods of forming the semiconductor device according to the embodiment shown in FIG. 8C. Referring to FIG. 25A, an insulation layer 115 is formed on a substrate 101. A top surface of the insulation layer 115 is on substantially the same level with top surfaces of the plurality of multi-channel active patterns F1 and F2.

Referring to FIG. 25B, a mask 119a is formed on the plurality of multi-channel active patterns F1 and F2 and the insulation layer 115, and the insulation layer 115 is patterned using the mask 119a, thereby completing the field insulation layer 110. When the insulation layer 115 is patterned using the mask 119a, portions of the top surfaces of the multi-channel active patterns F1 and F2, which are not covered by the mask 119a, are etched. However, portions of the top surfaces of the multi-channel active patterns F1 and F2, which are covered by the mask 119a, are not etched. As the result, a semiconductor part 166 is formed. Referring again to FIG. 8C, a normal gate 147_1, a dummy gate 247_1 and an elevated source/drain 162 are formed.

Figure 26:
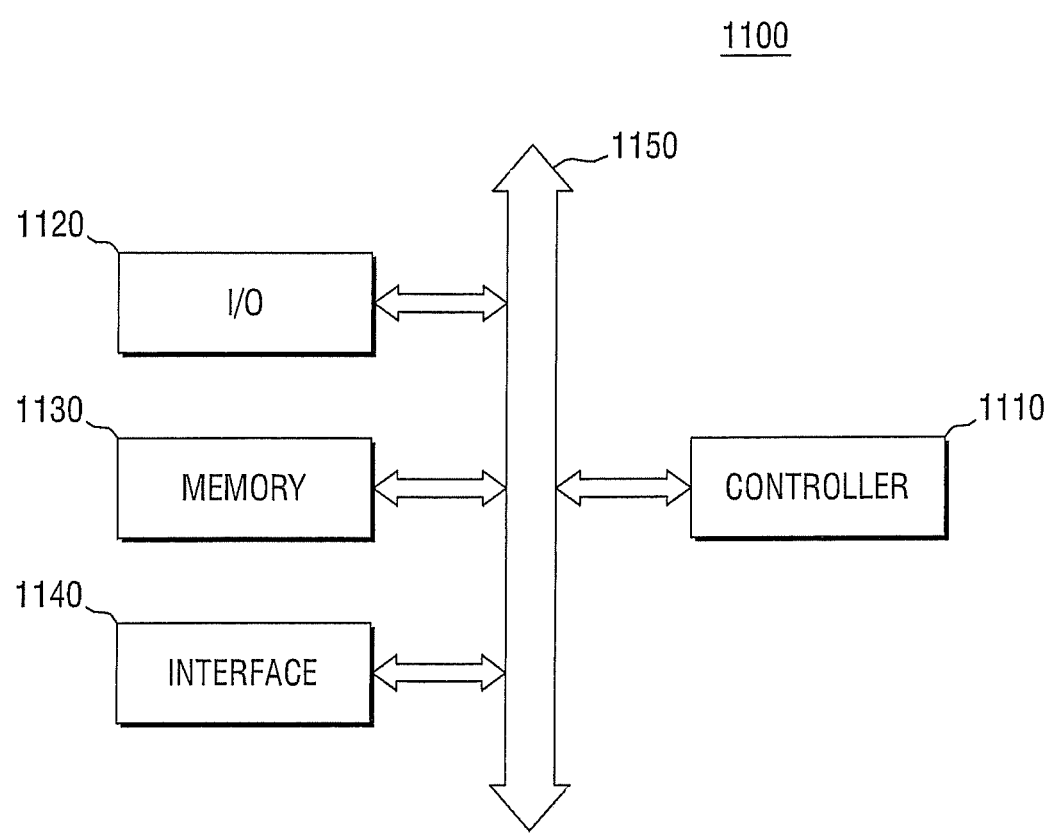
FIG. 26 is a block diagram of an electronic system including a semiconductor device according to some embodiments of the present inventive concept.

FIG. 26 is a block diagram of an electronic system including a semiconductor device according to some embodiments of the present inventive concept. Referring to FIG. 26, the electronic system 1100 may include a controller 1110, an input/output device (I/O) 1120, a memory device 1130, an interface 1140 and a bus 1150. The controller 1110, the I/O 1120, the memory device 1130, and/or the interface 1140 may be connected to each other through the bus 1150. The bus 1150 corresponds to a path through which data moves.

The controller 1110 may include at least one of a microprocessor, a digital signal processor, a microcontroller, and logic elements capable of functions similar to those of these elements. The I/O 1120 may include a key pad, a key board, a display device, and so on. The memory device 1130 may store data and/or codes. The interface 1140 may perform functions of transmitting data to a communication network or receiving data from the communication network. The interface 1140 may be wired or wireless. For example, the interface 1140 may include an antenna or a wired/wireless transceiver, and so on. The electronic system 1100 may further include high-speed DRAM and/or SRAM as the operating memory for improving the operation of the controller 1110. Fin type FETs according to embodiments of the present inventive concept may be incorporated into the memory device 1130 or provided as part of the I/O 1120 or other portions of FIG. 2C.

The electronic system 1100 may be a personal digital assistant (PDA), a portable computer, a web tablet, a wireless phone, a mobile phone, a digital music player, a memory card, or any type of electronic device capable of transmitting and/or receiving information in a wireless environment.

Figure 27A:
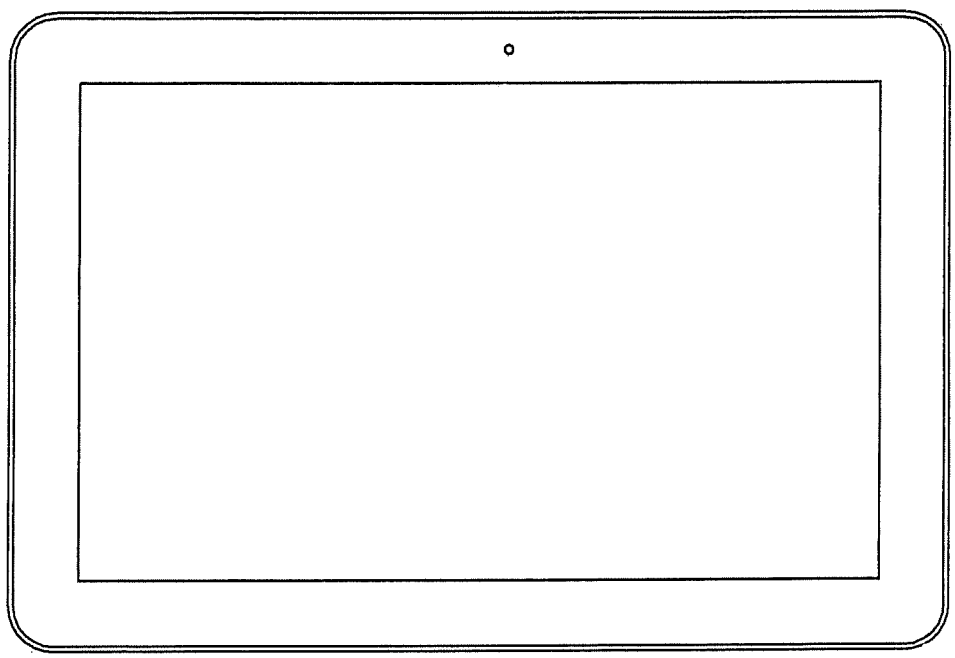
FIGS. 27A and 27B illustrate exemplary semiconductor systems in which semiconductor devices according to some embodiments of the present inventive concept can be employed.
Figure 27B:
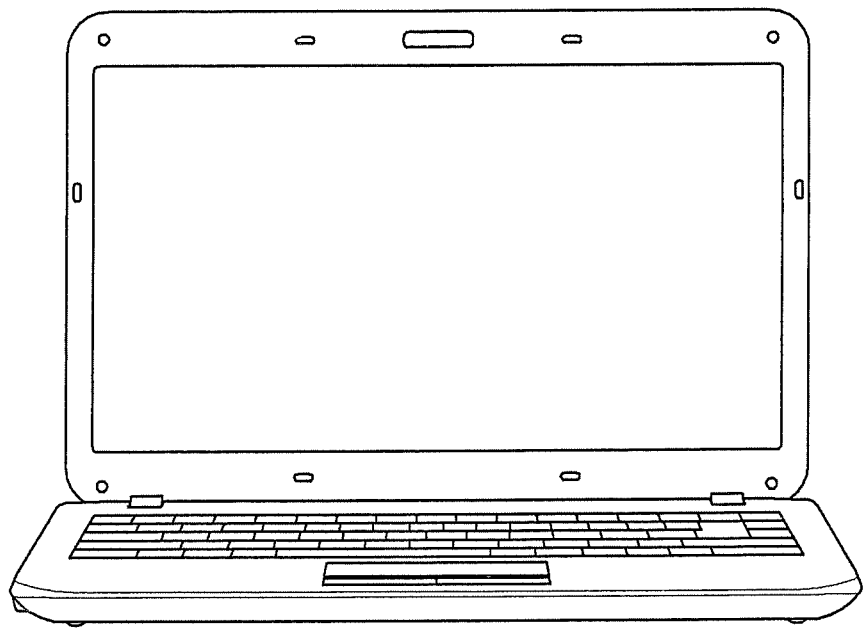

FIGS. 27A and 27B illustrate an exemplary system to which semiconductor devices according to some embodiments of the present inventive concept can be applied. FIG. 27A illustrates an example in which a semiconductor device according to an embodiment of the present inventive concept is applied to a tablet, and FIG. 27B illustrates an example in which a semiconductor device according to an embodiment of the present inventive concept is applied to a notebook computer. At least one of the semiconductor devices according to some embodiments of the present inventive concept can be included in the tablet PC, the notebook computer, or the like.

While the present inventive concept has been particularly shown and described with reference to exemplary embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
   a first channel active pattern protruding from a substrate and extending in a first direction;
   a second channel active pattern protruding from the substrate and extending in the first direction, wherein the first and second channel active pattern are separated from one another in the first direction;
   a field insulation layer disposed on the substrate;
   a source/drain region between the first channel active pattern and the field insulation layer;
   a first gate pattern disposed on the first channel active pattern and including a first gate and a first gate spacer; and
   a second gate pattern disposed on the field insulation layer and including a second gate and a second gate spacer,
   wherein the second gate and the field insulation layer are disposed to be misaligned with each other, and
   wherein the second gate pattern vertically overlaps a portion of the first channel active pattern and a portion of the second channel active pattern.

2. The semiconductor device of claim 1, wherein the substrate comprises one or more semiconductor materials, or a silicon on insulator substrate.

3. The semiconductor device of claim 1, wherein the first channel active pattern is fin-shaped and includes an epitaxial layer grown from the substrate.

4. The semiconductor device of claim 1, wherein the field insulation layer comprises an oxide layer, a nitride layer, an oxynitride layer, or a combination thereof.

5. The semiconductor device of claim 1, wherein the source/drain region comprises an epitaxial layer.

6. The semiconductor device of claim 1, wherein each of the first gate and the second gate comprises a first metal layer and a second metal layer, the second metal layer filling a space formed by the first metal layer.

7. The semiconductor device of claim 6, wherein the first metal layer comprises at least one of TiN, TaN, TiC or TaC, and the second metal layer comprises W or Al.

8. The semiconductor device of claim 1, further comprising:
   a gate insulation layer disposed between the second gate and a top surface of the field insulation layer,
   wherein the gate insulation layer comprises $HfO_2$, $ZrO_2$, or $Ta_2O_5$.

9. A semiconductor device comprising:
   a channel active pattern protruding from a substrate and extending along a first direction;
   a field insulation layer disposed on the substrate, wherein the field insulation layer comprises a major surface and a protruding portion extending from the major surface;
   a source/drain region between the channel active pattern and the field insulation layer;
   a first gate disposed on the channel active pattern and extending along a second direction intersecting the first direction; and
   a second gate disposed on the protruding portion of the field insulation layer and extending along the second direction,
   wherein the second gate and the field insulation layer are disposed to be misaligned with each other in a third direction perpendicular to the first and second directions.

10. The semiconductor device of claim 9, wherein the substrate comprises one or more semiconductor materials, or a silicon on insulator substrate.

11. The semiconductor device of claim 9, wherein the channel active pattern is fin-shaped and includes an epitaxial layer grown from the substrate.

12. The semiconductor device of claim 9, wherein the field insulation layer comprises an oxide layer, a nitride layer, an oxynitride layer, or a combination thereof.

13. The semiconductor device of claim 9, wherein the source/drain region comprises an epitaxial layer.

14. The semiconductor device of claim 9, wherein each of the first gate and the second gate comprises a first metal layer and a second metal layer, the second metal layer filling a space formed by the first metal layer.

15. The semiconductor device of claim 14, wherein the first metal layer comprises at least one of TiN, TaN, TiC or TaC, and the second metal layer comprises W or Al.

16. The semiconductor device of claim 9, wherein a gate insulation layer is disposed between the second gate and a top surface of the field insulation layer.

17. The semiconductor device of claim 16, wherein the gate insulation layer comprises $HfO_2$, $ZrO_2$, or $Ta_2O_5$.

18. A semiconductor device comprising:
a channel active pattern protruding from a substrate;
a field insulation layer disposed on the substrate;
a source/drain region between the channel active pattern and the field insulation layer;
a first gate pattern disposed on the channel active pattern and including a first gate and a first gate spacer; and
a second gate pattern disposed on the field insulation layer and including a second gate and a second gate spacer,
wherein a first portion of the second gate pattern overlaps with a portion of the channel active pattern,
wherein a second portion of the second gate pattern overlaps with the field insulation layer,
wherein a third portion of the second gate pattern does not overlap with the channel active pattern and the field insulation layer,
wherein the second portion of the second gate pattern is between the first portion of the second gate pattern and the third portion of the second gate pattern, and
wherein a top surface of the field insulation layer is located at the same vertical level or higher than a top surface of the channel active pattern.

19. The semiconductor device of claim 18, wherein a gate insulation layer is disposed between the second gate and a top surface of the field insulation layer.

20. The semiconductor device of claim 18, wherein each of the first gate and the second gate comprises a first metal layer and a second metal layer, the second metal layer filling a space formed by the first metal layer.

* * * * *